(12) United States Patent
Akiba et al.

(10) Patent No.: US 7,847,413 B2
(45) Date of Patent: Dec. 7, 2010

(54) SEMICONDUCTOR DEVICE AND METHOD OF MANUFACTURING THE SAME

(75) Inventors: Toshihiko Akiba, Tokyo (JP); Takahiro Naito, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 654 days.

(21) Appl. No.: 11/798,737

(22) Filed: May 16, 2007

(65) Prior Publication Data

US 2008/0006947 A1 Jan. 10, 2008

(30) Foreign Application Priority Data

Jul. 4, 2006 (JP) ............................. 2006-183993

(51) Int. Cl.
*H01L 23/52* (2006.01)
(52) U.S. Cl. .................... 257/777; 257/686; 257/738; 257/E21.001; 257/786
(58) Field of Classification Search ......... 257/678–733, 257/787–796, E23.001–E23.194
See application file for complete search history.

(56) References Cited

U.S. PATENT DOCUMENTS 7,550,680 B2 * 6/2009 Pendse ....................... 174/520

2005/0006745 A1 1/2005 Nishimura
2007/0013043 A1 * 1/2007 Pan et al. .................... 257/686
2008/0036050 A1 * 2/2008 Lin et al. .................... 257/659

FOREIGN PATENT DOCUMENTS

JP 2005-019568 A 1/2005

* cited by examiner

*Primary Examiner*—N Drew Richards
*Assistant Examiner*—Mamadou Diallo
(74) *Attorney, Agent, or Firm*—Miles & Stockbridge P.C.

(57) ABSTRACT

A semiconductor device having a microcomputer chip and a plurality of high-speed memory chips and capable of making wiring lines of the memory chips equal in length is disclosed. The semiconductor device comprises a first wiring substrate, a microcomputer chip mounted over the first wiring substrate, a second wiring substrate disposed over the microcomputer chip, a plurality of first solder bumps for connecting the first and second wiring substrates with each other, and a plurality of second solder bumps as external terminals formed over a back surface of the wiring substrate. A first memory chip and a second memory chip, as high-speed memory chips, are stacked within the second wiring substrate, wiring of the first memory chip and that of the second memory chip are made equal in length within the second wiring substrate, and a completed package structure having the second wiring substrate is mounted over a completed package structure having the first wiring substrate.

6 Claims, 28 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2006-183993 filed on Jul. 4, 2006 including the specification, drawings and abstract is incorporated herein by reference in its entirety.

BACKGROUND OF THE INVENTION

The present invention relates to a semiconductor device and a method of manufacturing the same. Particularly, the present invention is concerned with a technique applicable effectively to a semiconductor device having a microcomputer chip and memory chips, as well as assembling thereof.

There is known a technique (see, for example, Patent Literature 1) using a first wiring substrate having a semiconductor element mounted on an upper surface thereof, a second wiring substrate stacked on the first wiring substrate through plural electrode terminals which are connected electrically to the first wiring substrate, and conductor support members disposed around the semiconductor element and connected to ground wiring layers formed on the first and second wiring substrates.

[Patent Literature 1]
Japanese Patent Laid-Open Publication No. 2005-19568 (FIG. 1)

SUMMARY OF THE INVENTION

As an example of a semiconductor device having plural semiconductor chips there is known a semiconductor device called SIP (System In Package) having mounted on a wiring substrate a semiconductor chip (hereinafter also referred to as "microcomputer chip") having an arithmetic processing function and a semiconductor chip (hereinafter also referred to as "memory chip") having a memory circuit.

As the semiconductor device function becomes higher, there exists a demand for higher reduction in size and thickness of SIP. In SIP, in many cases, plural memory chips are mounted and so there is adopted a chip stack type structure. For example, memory chips are stacked in multiple stages on a wiring substrate and are each connected electrically to the wiring substrate by wire bonding.

On the other hand, as to the microcomputer chip, since it plays the role of an external interface with the memory chip, it is preferably disposed at a position closer to a mounting substrate with respect to the memory chips.

In this connection, a technique of stacking plural memory chips on an upper substrate and mounting a microcomputer chip on a lower substrate to reduce the size of the semiconductor device concerned is disclosed in the foregoing Patent Literature 1 (Japanese Patent Laid-Open Publication No. 2005-19568).

In SIP, plural memory chips are mounted with respect to a microcomputer chip, and with the recent speed-up of system there has been used an SDRAM (Synchronous Dynamic Random Access Memory) for high speed in accordance with a DDR (Double Date Rate) method for memory chips. The DDR method utilizes both leading and falling edges of an external clock signal when synchronizing between circuits. As a processing operation, data signals are transmitted from a microcomputer chip to memory chips. If signals are returned from the memory chips to the microcomputer chip almost simultaneously, it follows that the processing has been executed. Therefore, it is required that wiring lines for connecting between one microcomputer chip and plural memory chips be equal in length.

However, in the structure described in the foregoing Patent Literature 1, both bump connection and wire connection are mixed in the connection of plural memory chips stacked on the upper substrate with the substrate, thus giving rise to the problem that it is impossible to make wiring lines equal in length.

There has been proposed a structure wherein plural semiconductor chips are embedded within a substrate. In this structure, however, the substrate is apt to warp due to a difference in thermal expansion coefficient between the material (resin) of the substrate and the material (Si) of the semiconductor chips), thus making it difficult to connect this substrate by solder.

It is an object of the present invention to provide a technique capable of making wiring lines for plural memory chips equal in length in a semiconductor device having a microcomputer chip and plural memory chips.

It is another object of the present invention to provide a technique which permits solder-connecting of a substrate with plural memory chips embedded therein.

The above and other objects and novel features of the present invention will become apparent from the following description and the accompanying drawings.

The following is an outline of typical modes of the present invention as disclosed herein.

In one aspect of the present invention there is provided a semiconductor device comprising a first wiring substrate, a microcomputer chip mounted over the first wiring substrate, a second wiring substrate disposed over the microcomputer chip, and a plurality of first bump electrodes for connecting the first and second wiring substrates with each other, wherein the second wiring substrate incorporates first and second memory chips, the second memory chip being disposed over the first memory chip, the first and second memory chips transferring data in synchronism with both leading and trailing edges of an external clock signal.

In another aspect of the present invention there is provided a method of manufacturing a semiconductor device, comprising the steps of providing a first wiring substrate having a plurality of first bonding leads formed over a main surface thereof and providing a second wiring substrate, the second wiring substrate incorporating a first memory chip and a second memory chip both adapted to transfer data in synchronism with both leading and trailing edges of an external clock signal, the second memory chip being disposed over the first memory chip. In a further aspect of the present invention there is provided a method of manufacturing a semiconductor device, comprising the steps of mounting a microcomputer chip over a main surface of a first wiring substrate, applying solder paste over a plurality of first bonding leads of the first wiring substrate, connecting first bump electrodes to a plurality of second bonding leads of a second wiring substrate, and connecting the first bump electrodes and the solder paste with each other to mount the second wiring substrate over the first wiring substrate.

The following is a brief description of effects obtained by the typical modes of the present invention as disclosed herein.

In a semiconductor device having a microcomputer chip and a plurality of high-speed memory chips, it is possible to make wiring lines of the memory chips equal to another.

Moreover, by applying solder paste over the first bonding leads of the first wiring substrate, it is possible to connect the first bump electrode and the solder paste with each other and thereby mount the second wiring substrate over the first wiring substrate, thus permitting solder-connecting of the second wiring substrate easy to warp and having plural memory chips embedded therein. In this way the first wiring substrate carrying the microcomputer chip thereover and difficult to warp can be disposed as a lower substrate and the second wiring substrate easy to warp can be mounted over the first wiring substrate through the first bump electrodes.

DETAILED DESCRIPTION OF PREFERRED EMBODIMENTS

Figure 1:
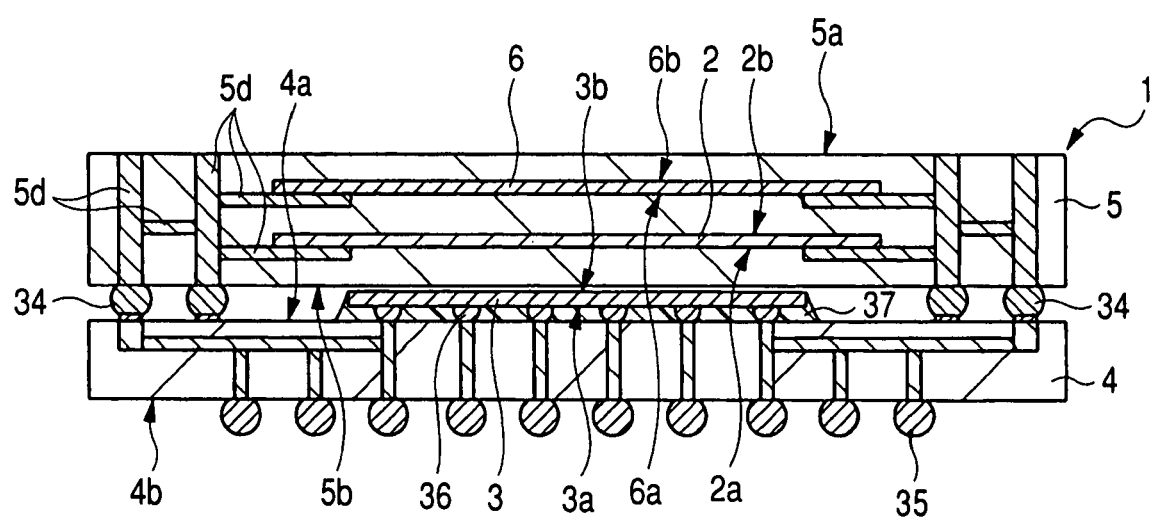
FIG. 1 is a sectional view showing schematically a structural example of a semiconductor device according to a first embodiment of the present invention.

In the following embodiments, as to the same or similar portions, repeated explanations thereof will be omitted in principle except where required.

Where required for convenience sake, the following embodiments will each be described in a divided manner into plural sections or embodiments, but unless otherwise mentioned, they are not unrelated to each other but are in a relation such that one is a modification or a detailed or supplementary explanation of part or the whole of the other.

In the following embodiments, when reference is made to the number of elements (including the number, numerical value, quantity and range), no limitation is made to the number referred to, but numerals above and below the number referred to will do as well unless otherwise mentioned and except the case where it is basically evident that limitation is made to the number referred to.

Embodiments of the present invention will be described in detail hereinunder with reference to the accompanying drawings. In all of the drawings for illustrating the embodiments, portions having the same functions are identified by like reference numerals, and repeated explanations thereof will be omitted.

First Embodiment

Figure 2:
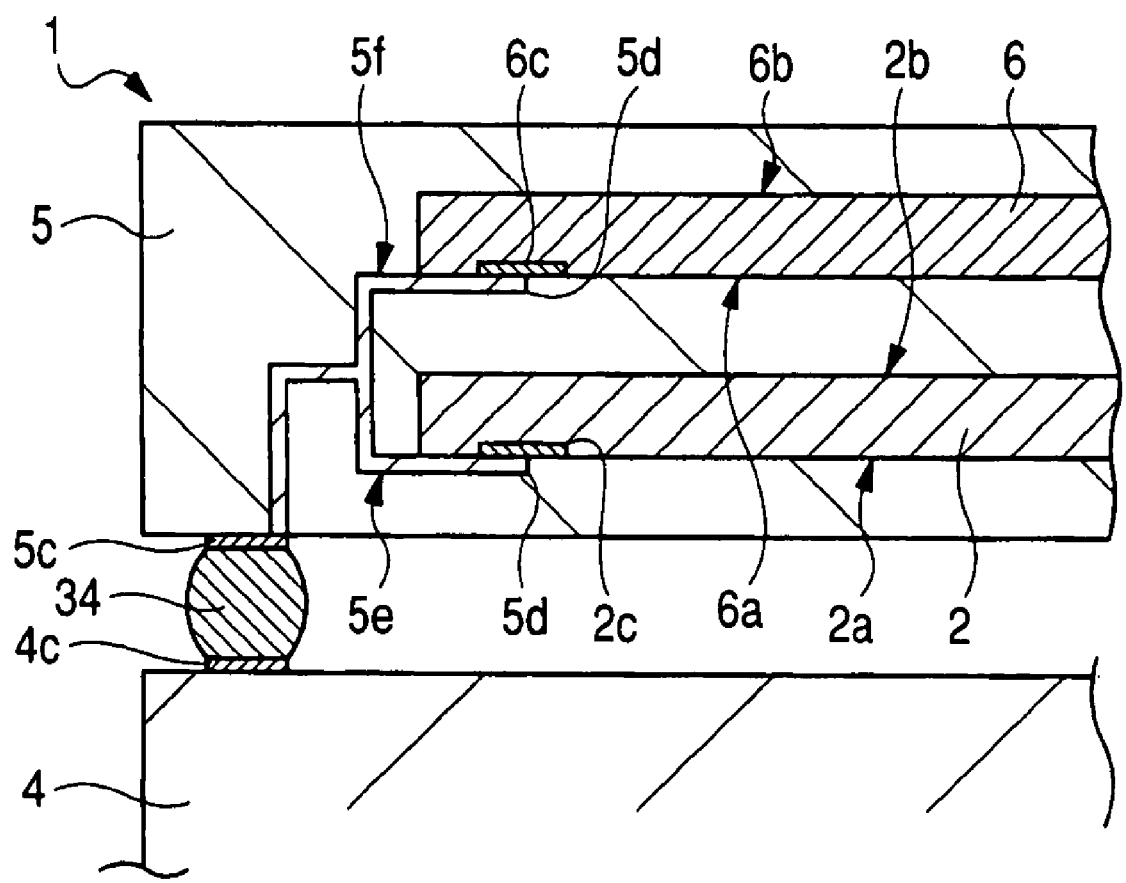
FIG. 2 is a partial structural diagram showing schematically an equilength wiring structure of the semiconductor device shown in FIG. 1.
Figure 3:
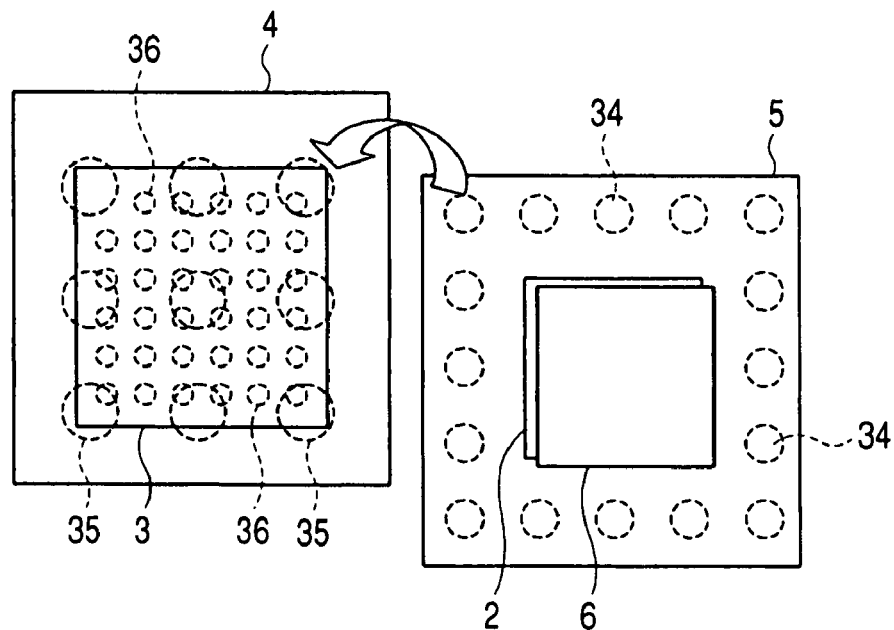
FIG. 3 is a plan view showing the structure of the semiconductor device of FIG. 1 in a developed state substrate by substrate.
Figure 4:
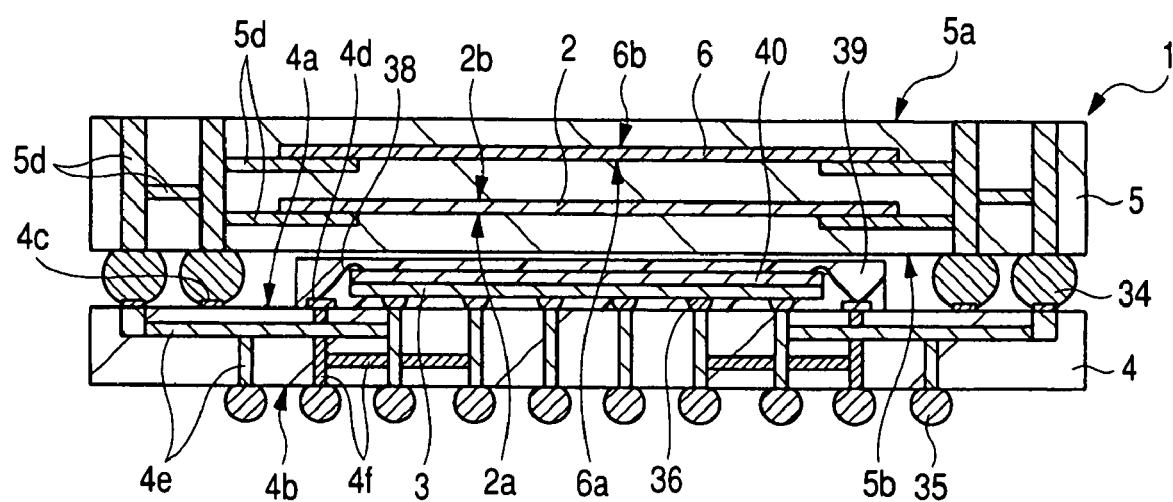
FIG. 4 is a sectional view showing schematically the structure of a semiconductor device according to a modification of the first embodiment.
Figure 5:
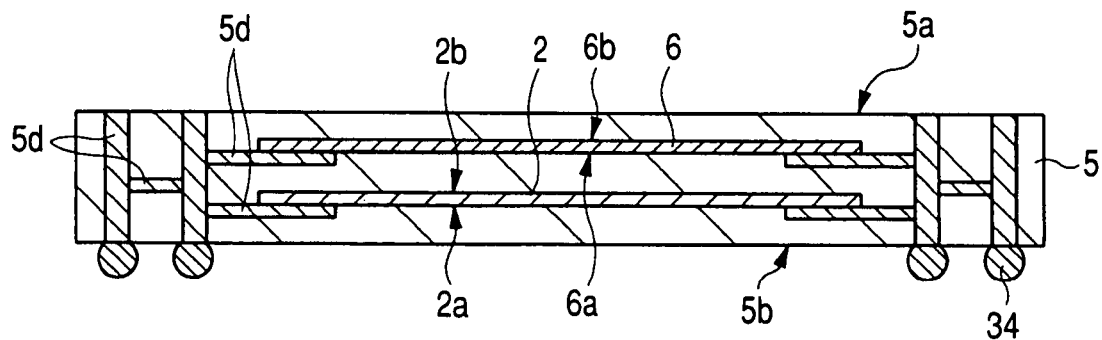
FIG. 5 is a sectional view showing the structure of an upper package in the semiconductor device of FIG. 1.
Figure 6:
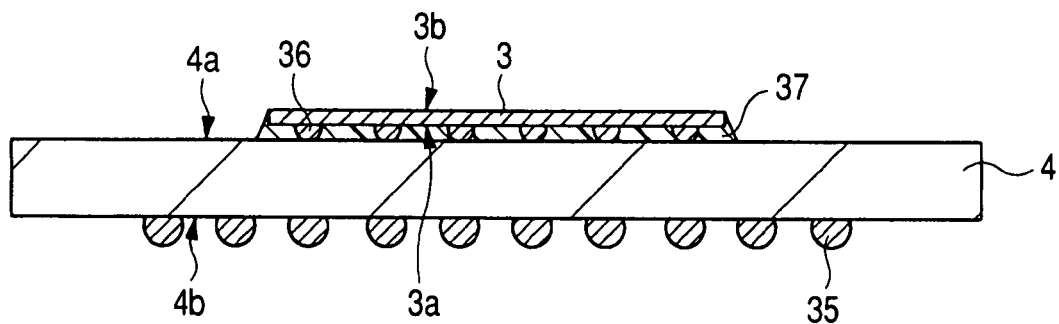
FIG. 6 is a sectional view showing the structure of a lower package in the semiconductor device of FIG. 1.
Figure 7:
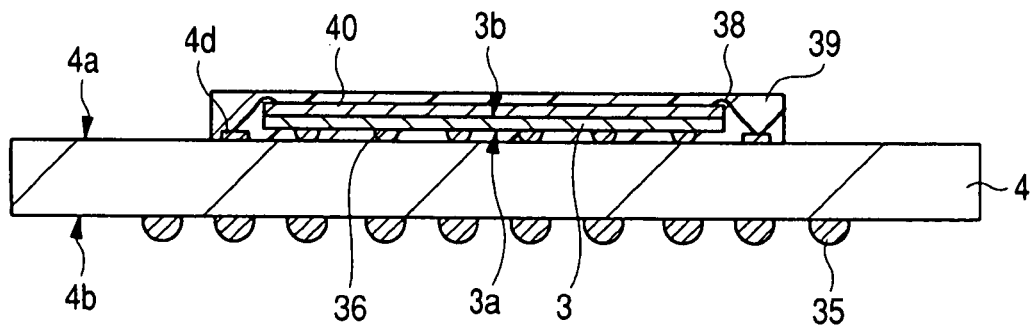
FIG. 7 is a sectional view showing the structure of a lower package in the semiconductor device of FIG. 4.
Figure 8:
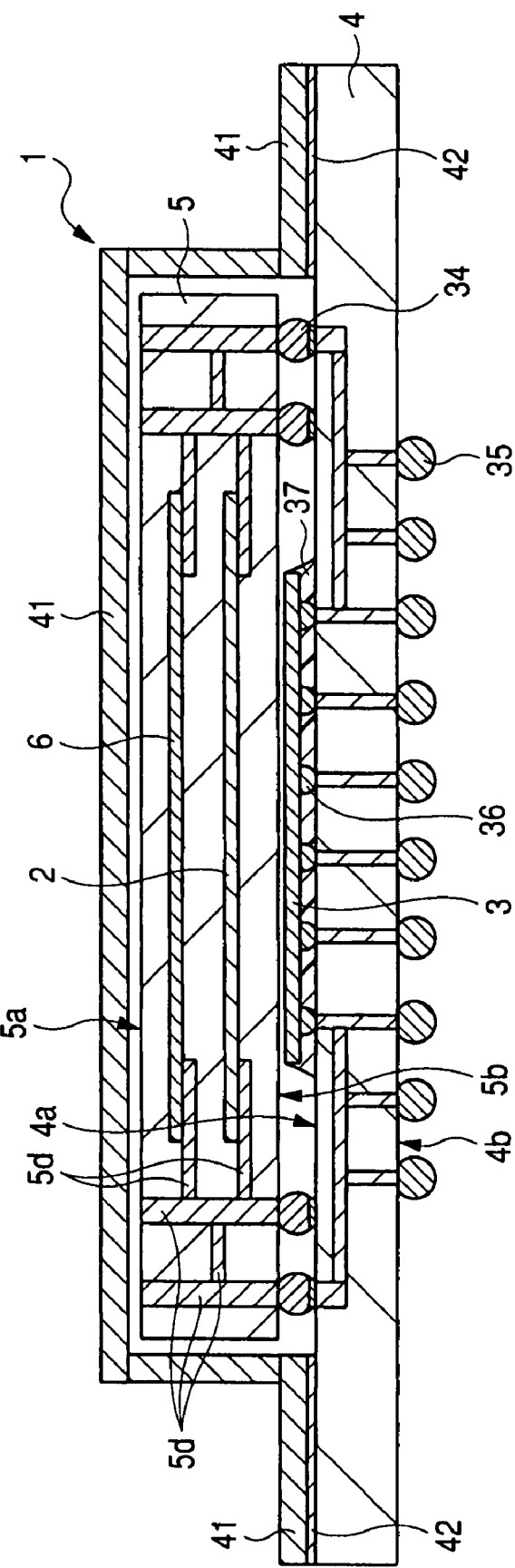
FIG. 8 is a sectional view showing schematically the structure of a semiconductor device according to another modification of the first embodiment.
Figure 9:
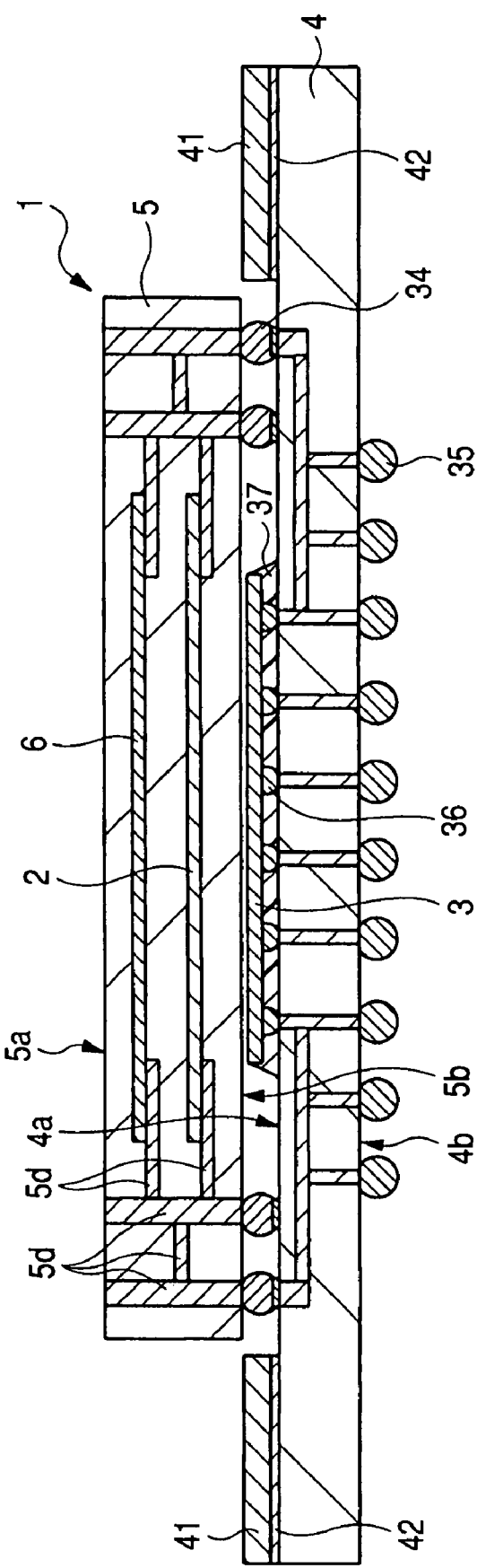
FIG. 9 is a sectional view showing schematically the structure of a semiconductor device according to a further modification of the first embodiment.
Figure 10:
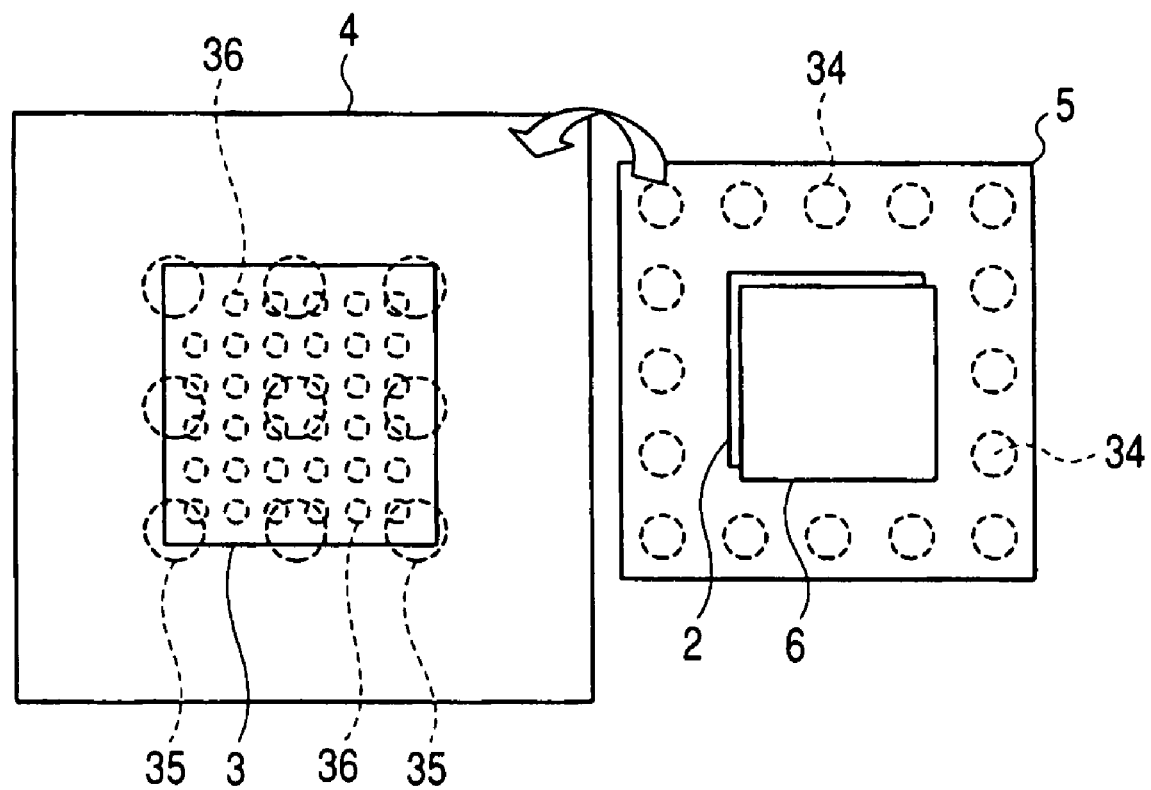
FIG. 10 is a plan view showing the structure of the semiconductor device of FIG. 8 in a developed state substrate by substrate.
Figure 11:
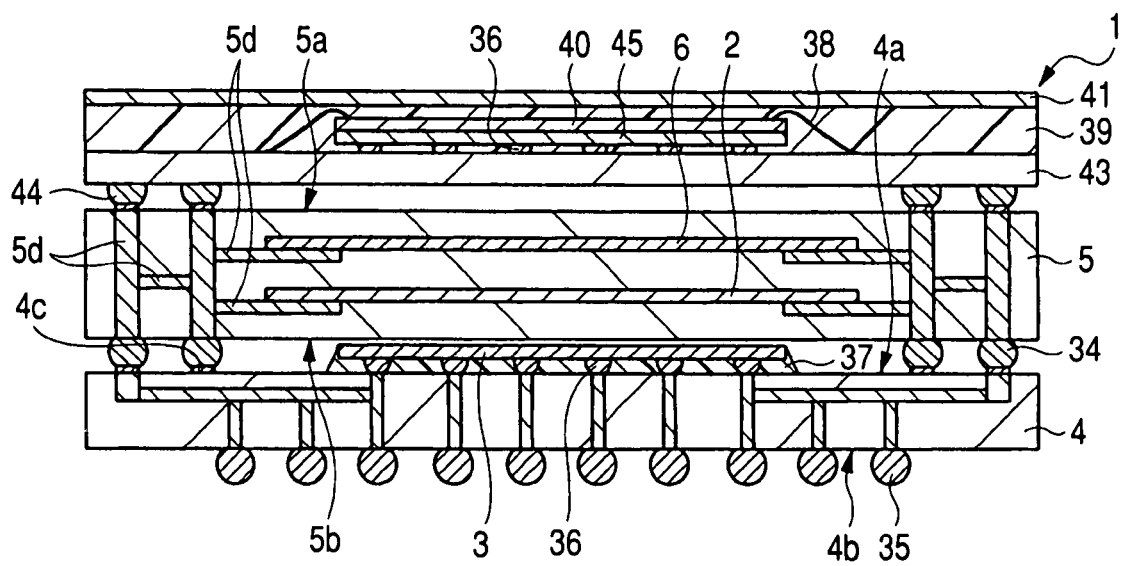
FIG. 11 is a sectional view showing schematically the structure of a semiconductor device according to a still further modification of the first embodiment.
Figure 12:
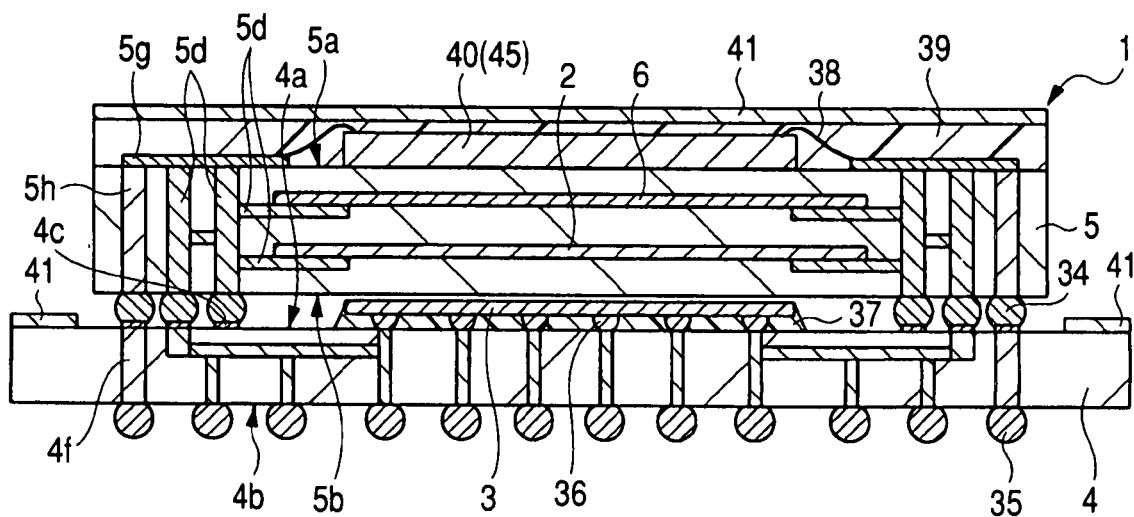
FIG. 12 is a sectional view showing schematically the structure of a semiconductor device according to a still further modification of the first embodiment.

FIG. 1 is a sectional view showing schematically a structural example of a semiconductor device according to a first embodiment of the present invention, FIG. 2 is a partial structural diagram showing schematically an equilength wiring structure of the semiconductor device shown in FIG. 1, FIG. 3 is a plan view showing the structure of the semiconductor device of FIG. 1 in a developed state substrate by substrate, and FIG. 4 is a sectional view showing schematically the structure of a semiconductor device according to a modification of the first embodiment. FIG. 5 is a sectional view showing the structure of an upper package in the semiconductor device of FIG. 1, FIG. 6 is a sectional view showing the structure of a lower package in the semiconductor device of FIG. 1, FIG. 7 is a sectional view showing the structure of a lower package in the semiconductor device of FIG. 4, FIG. 8 is a sectional view showing schematically the structure of a semiconductor device according to another modification of the first embodiment, and FIG. 9 is a sectional view showing schematically the structure of a semiconductor device according to a further modification of the first embodiment. Further, FIG. 10 is a plan view showing the structure of the semiconductor device of FIG. 8 in a developed state substrate by substrate, FIG. 11 is a sectional view showing schematically the structure of a semiconductor device according to a still further modification of the first embodiment, and FIG. 12 is a sectional view showing schematically the structure of a semiconductor device according to a still further modification of the first embodiment.

The semiconductor device of the first embodiment shown in FIGS. 1 to 3 has plural semiconductor chips and it is a semiconductor package having a substrate which incorporates plural semiconductor chips. In this first embodiment, reference will be made to SIP 1 as an example of the semiconductor device.

A description will be given about the configuration of the SIP 1. The SIP 1 comprises a first wiring substrate 4, the first wiring substrate having a main surface (first main surface) 4a and a back surface (first back surface) 4b opposed to the main surface 4a, a microcomputer chip 3 mounted on the main surface 4a of the first wiring substrate 4, a second wiring substrate 5 disposed on the microcomputer chip 3, the second wiring substrate 5 having a main surface (second main surface) 5a and a back surface (second back surface) 5b opposed to the main surface 5a, and a plurality of first solder bumps (first bump electrodes) 34 for connecting the first and second wiring substrates 4, 5 with each other electrically. Moreover, a plurality of second solder bumps (second bump electrodes) 35 as external terminals of SIP 1 are arranged in lattice shape on the back surface 4b of the first wiring substrate 4.

That is, the structure of the SIP 1 is a so-called POP (Package on Package) structure having the first wiring substrate 4, the microcomputer chip 3 mounted on the first wiring substrate 4, the second wiring substrate 5 disposed on the microcomputer chip 3, the first solder bumps 34 for connecting the first and second wiring substrates 4, 5 with each other, and the second solder bumps 35 formed on the back surface 4b of the first wiring substrate 4, and wherein a completed package structure having the second wiring substrate 5 is mounted on a completed package structure having the first wiring substrate 4.

Further, a first memory chip 2 and a second memory chip 6 are disposed in a stacked state in the interior of the second wiring substrate 5 and wiring of the first memory chip 2 and that of the second memory chip 6 are made equal to each other within the second wiring substrate 5.

The structure of the SIP 1 will now be described in detail. The second wiring substrate 5 is mounted on the first wiring substrate through the first solder bumps 34, and the microcomputer 3, which has an arithmetic processing function, is disposed in the area between the main surface 4a of the first wiring substrate 4 and the back surface 5b of the second wiring substrate 5. As shown in FIG. 3, the microcomputer chip 3 is disposed nearly centrally on the first wiring substrate 4 and is flip-chip-bonded through, for example, plural gold bumps 36 to plural bonding leads (not shown) for the microcomputer chip 3 out of plural first bonding leads 4c formed on the main surface 4a of the first wiring substrate 4. That is, as shown in FIG. 1, the microcomputer chip 3 is mounted in a state in which its main surface 3a faces downward and its back surface 3b faces upward. Further, the flip-chip bonding is filled with under-fill resin 37 and is protected thereby. By flip-chip-bonding the microcomputer chip 3 through the Au bumps 36 it is possible to cope with the narrowing of pitch.

As shown in FIG. 3, the first solder bumps 34 for connecting between the first and second wiring substrates 4, 5 are disposed outside and around the microcomputer chip 3. In the SIP 1 shown in FIG. 1, since the first and second wiring substrates 4, 5 are of the same size in the planar direction, the first solder bumps 34 are arranged side by side in the peripheral edge portions of the first and second wiring substrates 4, 5, as shown in FIG. 3. More particularly, the first solder bumps 34 are arranged side by side around the microcomputer chip 3 mounted on the main surface 4a of the first wiring substrate 4.

The second wiring substrate 5 incorporates the first memory chip 2 and the second memory chip 6 each having a memory circuit. The second memory chip 6 is disposed on the first memory chip 2, as shown in FIG. 1. More specifically, the first and second memory chips 2, 6 are embedded within the second wiring substrate 5 so that the second memory chip 6 is stacked on the first memory chip 2. The first and second memory chips 2, 6 are stacked in such a manner that their main surfaces 2a, 6a face in the same direction and so do their back surfaces 2b, 6b.

Thus, in the SIP 1 of this first embodiment, the structure on the lower side is a completed package structure with the microcomputer chip 3 mounted on the first wiring substrate 4 as shown in FIG. 6, while the structure on the upper side is a completed package structure with both first and second memory chips 2, 6 incorporated within the second wiring substrate 5 as shown in FIG. 5, and a stacked structure (hereinafter referred to also as "on-pack structure") of both completed package structures is the structure of the SIP 1.

Thus, a memory chip-related test and a microcomputer chip-related test can be conducted independently in each of the completed package structures, so that by combining and stacking good products with each other it is possible to improve the yield in assembling the SIP 1.

Further, since the package structure associated with memory chips and the package structure associated with a microcomputer chip can be combined with each other arbitrarily, it is possible to obtain a large number of variations and hence possible to implement various structures. In this case, it is also possible to select a suitable combination on the user side after test.

The first and second memory chips 2, 6 installed within the second wiring substrate 6 which is disposed on the upper side of the SIP 1 are, for example, double data rate synchronous DRAMs (Double Data Rate SDRAMs). The double data rate synchronous DRAM results from strengthening the synchronization timing of SDRAM to make the transfer rate twice as much and can cope with high speed. It transfers data in synchronism with both leading and trailing edges of an external clock signal.

Thus, in the first and second memory chips 2, 6, there are used both leading and trailing edges of an external clock signal and therefore it is necessary to take an extremely short timing. In this first embodiment, in the interior of the second wiring substrate 5, the length of an internal wiring line 5d connected to the first memory chip 2 and that of an internal wiring line 5d connected to the second memory chip 6 are made equal each other.

More specifically, in the internal wiring lines 5d of the second wiring substrate 5, as shown in FIG. 2, a first distance 5e from a first electrode pad 5c of the first memory chip 2 to a second bonding lead 5c of the second wiring substrate 5 corresponding to the first electrode pad 2c and a second distance 5f from a second electrode pad 6c of the second memory chip 6 to a second bonding lead 5c corresponding to the second electrode pad 6c are almost equal to each other.

Since the internal wiring lines are made equal to each other in the first and second memory chips 2, 6, it is possible to transfer data in synchronism with both leading and trailing edges of an external clock signal.

In connection with making the internal wiring lines 5d equal in length, an allowable range of the difference between the first and second distances 5e, 5f is, for example, within ±2 mm, preferably within ±1 mm.

In the SIP 1, the microcomputer chip 3 controls the input and output of data through between the exterior of the system and the first and second memory chips 2, 6 installed in the interior of the system. That is, information pieces such as address, command and clock are exchanged between plural memory chips. Therefore, as shown in FIG. 1, the microcomputer chip 3 and the first and second memory chips 2, 6 are connected together electrically through plural first bonding leads 4c, plural first solder bumps 34 and plural second bonding leads 5c. In this case, bonding leads for the microcomputer chip to which plural gold bumps 34 of the microcomputer chip 3 are connected electrically and plural first bonding leads 4c connected electrically to plural first solder bumps 34 are connected together electrically.

In the SIP 1 of this first embodiment, the microcomputer chip 3 and the memory chips are disposed on the lower side and the upper side, respectively.

This is because the second wiring substrate 5 incorporates two thin first and second memory chips 2, 6 and is therefore easier to warp than the first wiring substrate 4 with no semiconductor chip installed in the interior thereof. That is, the second wiring substrate 5 is easier to warp than the first wiring substrate 4 due to the difference in thermal expansion coefficient between substrate and chip, so if the second wiring substrate 5 is disposed on the lower side, it is impossible to ensure flatness of the surface (main surface 5a) of the second wiring substrate 5 and a mounting defect of the first wiring substrate 4 to be stacked on the upper side is apt to occur. However, in solder-connecting the first and second wiring substrates 4, 5 with each other at the time of assembly of the SIP 1, if solder paste 46 (receptive solder) is applied onto the first bonding leads 4c of the first wiring substrate 4 (see FIG. 35) and is connected to the first solder bumps 34, it is possible to connect the first and second wiring substrates 4, 5 with each other even when the second wiring substrate 5 is warped. Thus, since the first wiring substrate 4 which is little warped is disposed on the lower side, it is possible to effect mounting of the SIP 1 on the user side.

Moreover, the microcomputer chip 3 is much larger in the number of pins and larger in the amount of heat generated than the memory chips. That is, the microcomputer chip 3 is a mediator for the exterior in the transmission and reception of signals and is large in both the number of pins and the amount of heat generated. However, by disposing the microcomputer chip 3 on the first wiring substrate 4 as the lower substrate, the heat can be allowed to escape through the second solder bumps 35 to the mounting substrate on which the SIP 1 is mounted.

Thus, in the SIP 1 of this first embodiment, as described above, the first and second memory chips 2, 6 are installed in the interior of the second wiring substrate 5, the second memory chip 6 is disposed on the first memory chip 2, and the first and second memory chips 2, 6 are high-speed memory chips which transfer data in synchronism with leading and trailing edges of an external clock signal. In the second wiring substrate 5 incorporating such plural high-speed memory chips, the wiring lines of these memory chips (the first and second memory chips 2, 6) can be made equal in length.

Further, since the second wiring substrate 5 with chips incorporated therein and easy to warp is disposed on the upper side, the heat generated from the microcomputer chips 3 can be allowed to escape to the mounting substrate through the second solder bumps 35 as external terminals.

Next, a description will be given about a modification of the first embodiment. In an SIP 1 according to the modification shown in FIG. 4, semiconductor chips are stacked on the first wiring substrate 4 as the lower substrate. A lower semiconductor chip stacked on the first wiring substrate 4 is a flip-chip bonded microcomputer chip 3. Therefore, the microcomputer chip 3 is electrically connected to the first solder bumps 34 and the second solder bumps 35 through first internal wiring lines 4e of the first wiring substrate 4.

In the SIP 1 shown in FIG. 4, an upper semiconductor chip stacked on the first wiring substrate 4 may be a microcomputer chip 3 or a memory chip 40. The upper semiconductor chip is electrically connected through wires 38 to terminals 4d formed on the main surface 4a of the first wiring substrate 4. Since the upper semiconductor chip does not require such a high-speed processing as that required by the first and second memory chips 2, 6 which are installed within the second wiring substrate 5, the terminals 4d are connected to the second solder bumps 35 through second internal wiring lines 4f which are separated from the first internal wiring lines 4e. The lower microcomputer chip 3, the upper memory chip 40 and the wires 38 are resin-sealed with a sealing body 39.

Also in the SIP 1 shown in FIG. 4, the lower structure is a completed package structure wherein the microcomputer chip 3 and the memory chip 40 are stacked on the first wiring substrate 4 as shown in FIG. 7, while the upper structure is a completed package structure wherein the first and second memory chips 2, 6 are installed within the second wiring substrate 5 as shown in FIG. 5. The SIP 1 has a stacked structure (on-pack structure) of both completed package structures.

Thus, a memory chip-related test and a microcomputer chip-related test can be performed respectively in independent packages and therefore by combining and stacking good products with each other it is possible to improve the yield in assembling the SIP 1 shown in FIG. 4.

Next, in an SIP 1 according to another modification of the first embodiment, which is shown in FIG. 8, upper and lower substrates are different in size as shown in FIG. 10. A first wiring substrate 4 disposed on the lower side is much larger than a second wiring substrate 5 disposed on the upper side. Moreover, as shown in FIG. 8, the second wiring substrate 5 and a projecting portion of the first wiring substrate 4 projecting from the second wiring substrate 5 are covered with a heat dissipating plate 41, whereby heat dissipating performance of the SIP 1 can be improved. The heat dissipating plate 41 is fixed to a peripheral edge portion of a main surface 4a of the first wiring substrate 4 through an adhesive 42.

In an SIP 1 according to a further modification of the first embodiment, which is shown in FIG. 9, a heat dissipating plate 41 is fixed through an adhesive 42 to only the projecting portion of the first wiring substrate 4 projecting from the second wiring substrate 5, whereby it is possible to improve the heat dissipating performance of the SIP 1.

In an SIP 1 according to a still further modification of the first embodiment, which is shown in FIG. 11, a second wiring substrate 5 is stacked on a first wiring substrate 4 and a third wiring substrate 43 is stacked on the second wiring substrate 5 through third solder bumps 44. For example, a microcomputer chip 45 is flip-chip-bonded as a lower-stage element onto the third wiring substrate 43 through gold bumps 36 and a memory chip 40 is stacked on the microcomputer chip 45 and is electrically connected to the third wiring substrate 43 through wires 38. The microcomputer chip 45, memory chip 40 and wires 38 on the third wiring substrate 43 are resin-sealed with a sealing body 39. Further, a heat dissipating plate 41 is affixed to a surface of the sealing body 39.

In an SIP 1 according to a still further modification, which is shown in FIG. 12, for example a memory chip 40 (a microcomputer chip 45 will do) is mounted on a main surface 5a of a second wiring substrate 5 having a first memory chip 2 and a second memory chip 6 both embedded therein. The memory chip 40 is electrically connected through wires 38 to terminals 5g formed on the main surface 5a of the second wiring substrate 5. The memory chip 40 does not require such a high-speed processing as that required by the first and second memory chips 2, 6 which are installed within the second wiring substrate. Therefore, the terminals 5g are connected to the first solder bumps 34 through other internal wiring lines 5h which are separated from the internal wiring lines 5d.

Further, first solder bumps 34 are connected to second solder bumps 35 through second internal wiring lines 4h of a first wiring substrate 4.

On the main surface 5a of the second wiring substrate 5 the memory chip 40 and the wires 38 are resin-sealed with a sealing body 39 and a heat dissipating plate 41 is affixed to a surface of the sealing body 39 and is also affixed to a peripheral edge portion of the first wiring substrate 4 projecting from the second wiring substrate 5.

Thus, the SIPs 1 according to modifications shown respectively in FIGS. 11 and 12 are each a package of a multi-layer on-pack structure and can afford the same effects as those obtained by the SIP 1 shown in FIG. 1. Additionally, the function thereof can be further improved because they carry a larger number of semiconductor chips (including the memory chip 40 or the microcomputer chip 45).

The following description is now provided about assembling the SIP 1 of the first embodiment shown in FIG. 1.

Figure 23:
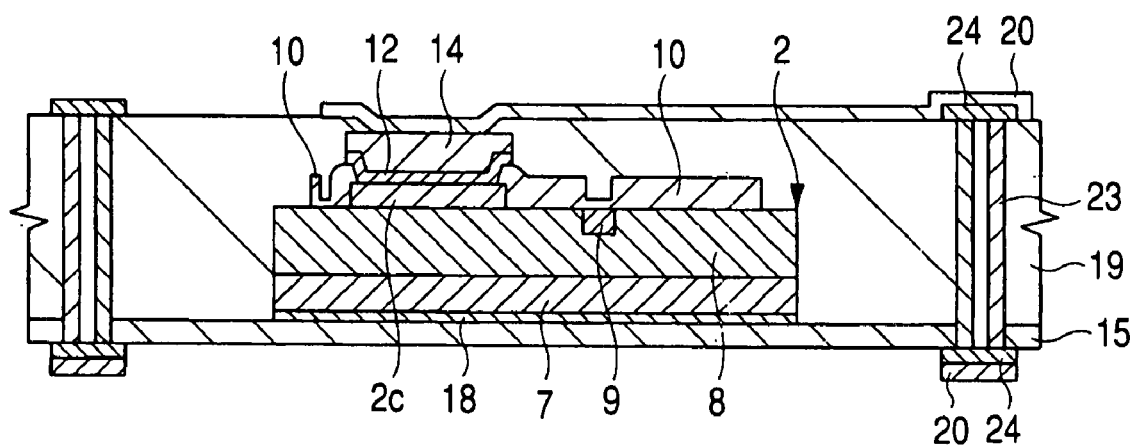
FIG. 23 is a partial sectional view showing a further step in the chip embedding method shown in FIG. 22.
Figure 24:
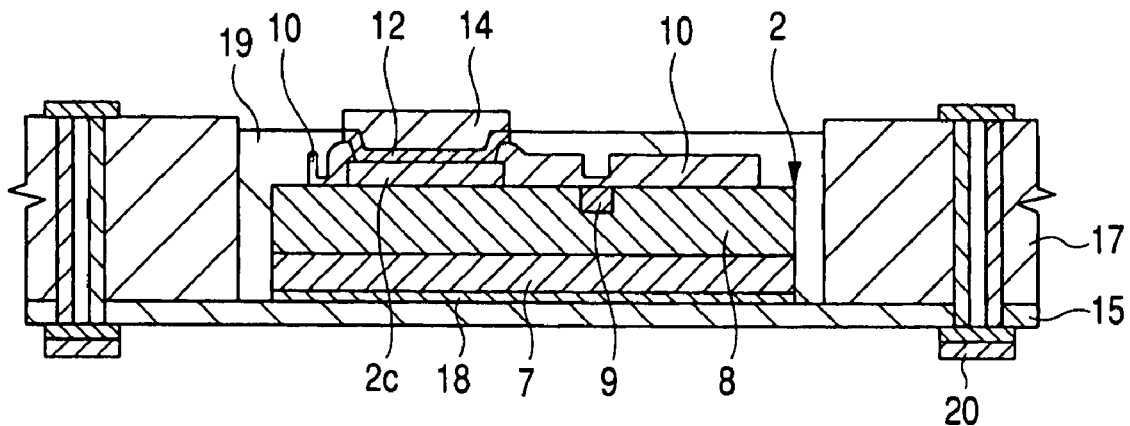
FIG. 24 is a partial sectional view showing a chip embedding method according to another modified example.
Figure 25:
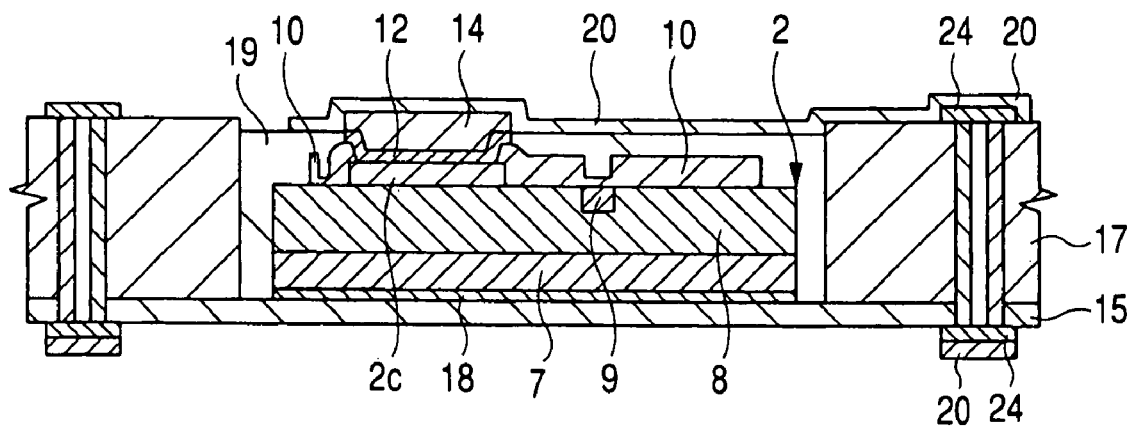
FIG. 25 is a partial sectional view showing a further step in the chip embedding method shown in FIG. 24.
Figure 26:
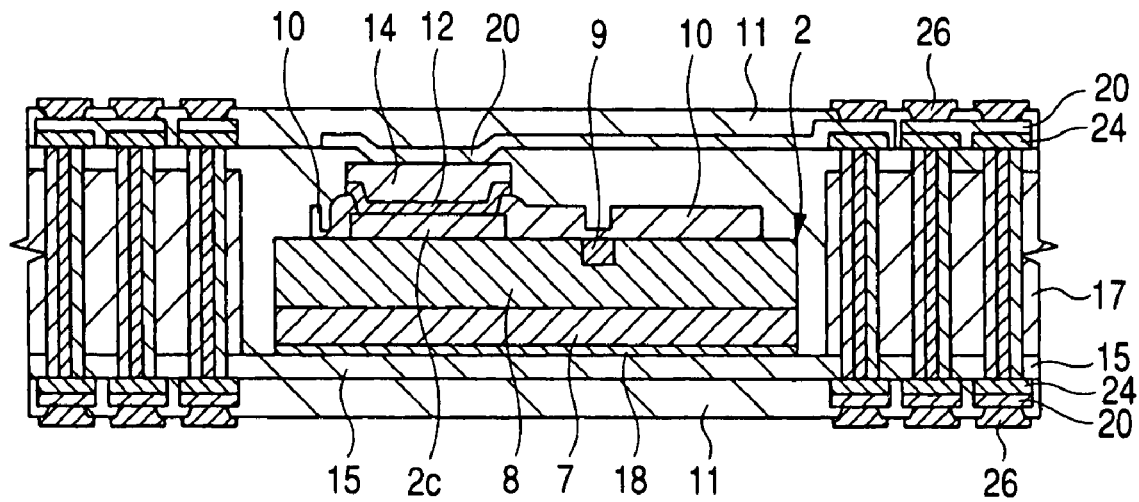
FIG. 26 is a partial sectional view showing a still further step in the chip embedding method shown in FIG. 25.
Figure 27:
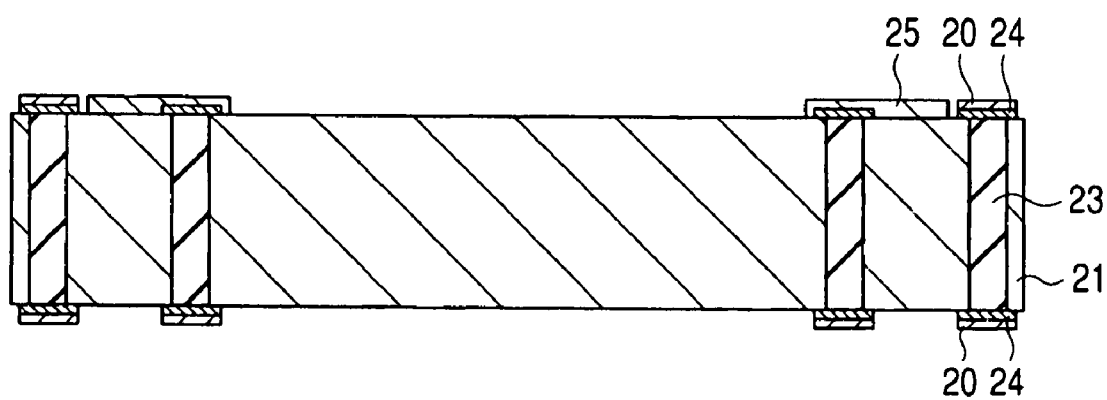
FIG. 27 is a partial sectional view showing an example of a built-in chip stacking method in assembling the semiconductor device of FIG. 1.
Figure 28:
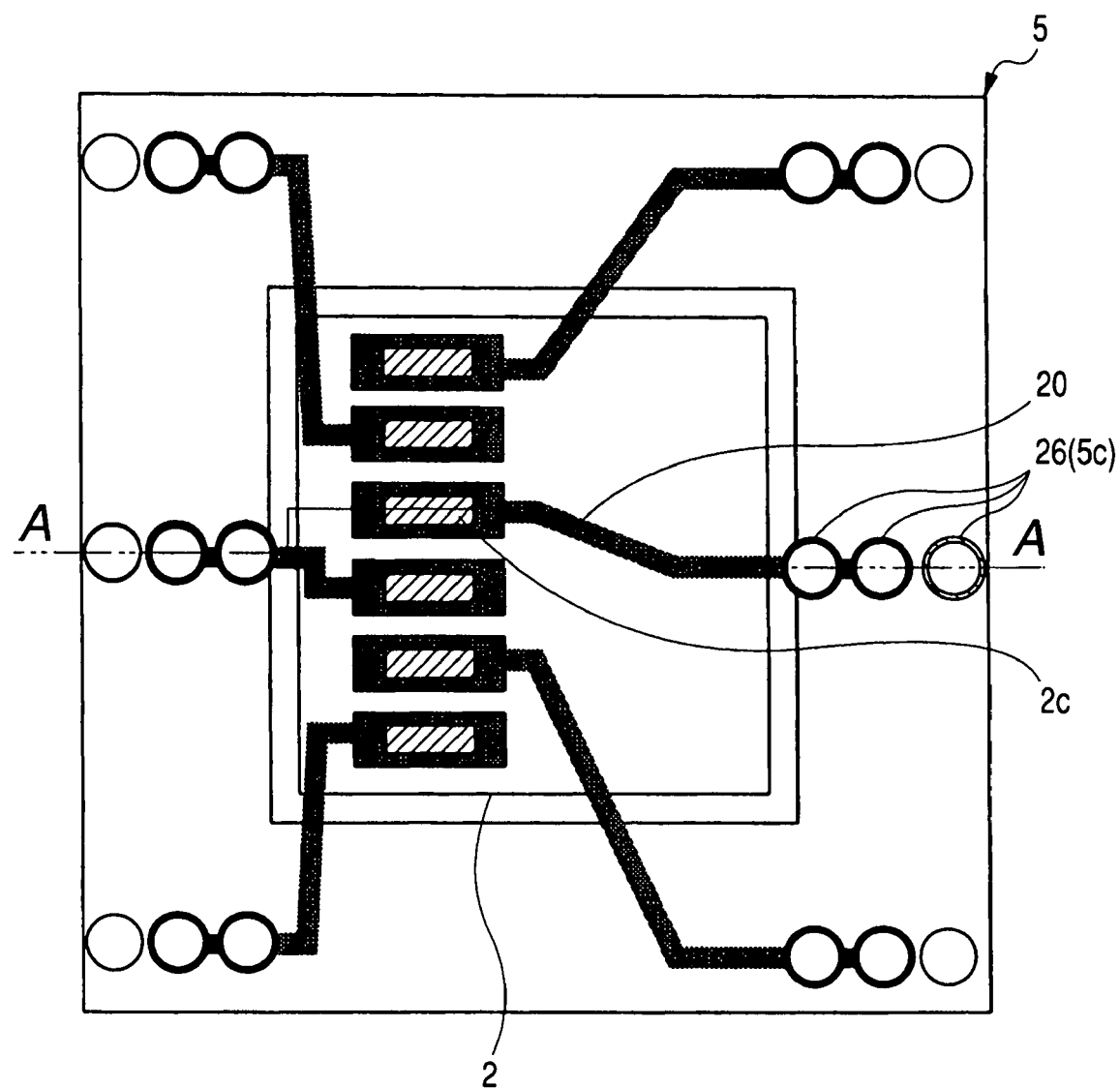
FIG. 28 is a back view showing an example of a substrate structure after the stacking of built-in chips in assembling the semiconductor device of FIG. 1.
Figure 29:
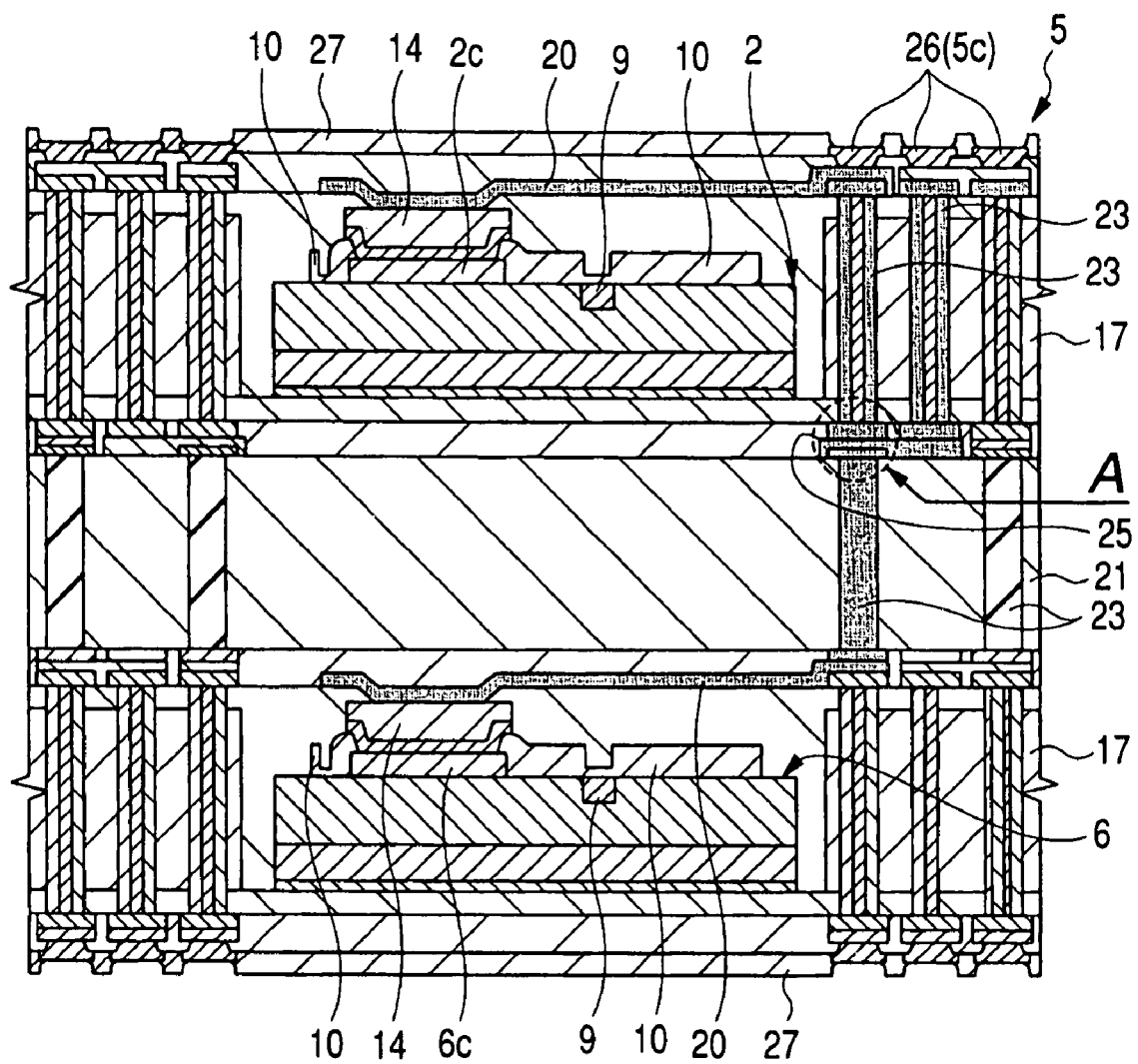
FIG. 29 is a sectional view taken along line A-A in FIG. 28, showing a structural example.
Figure 30:
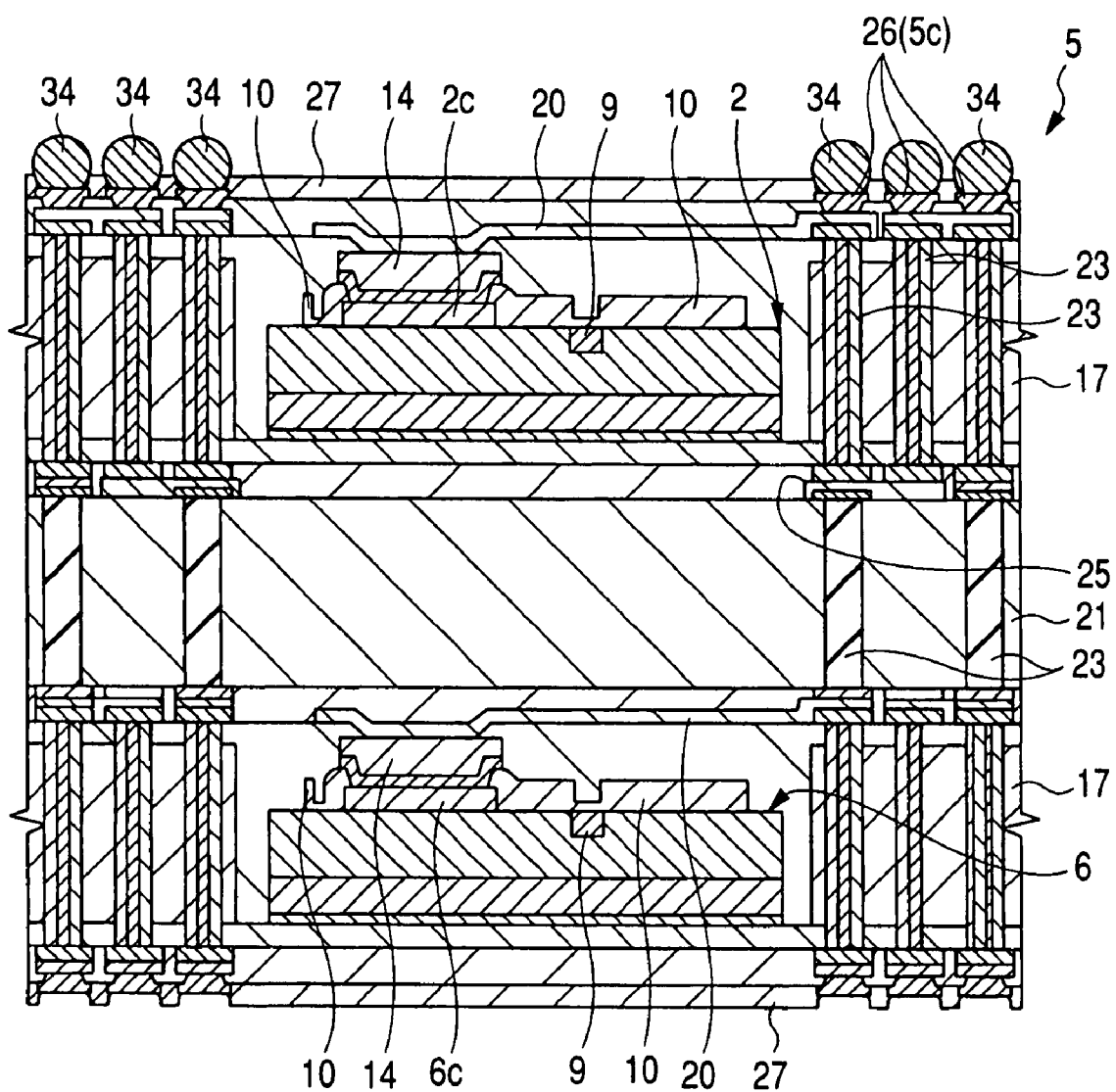
FIG. 30 is a partial sectional view showing a structural example after the mounting of first bump electrodes in assembling the semiconductor device of FIG. 1.
Figure 31:
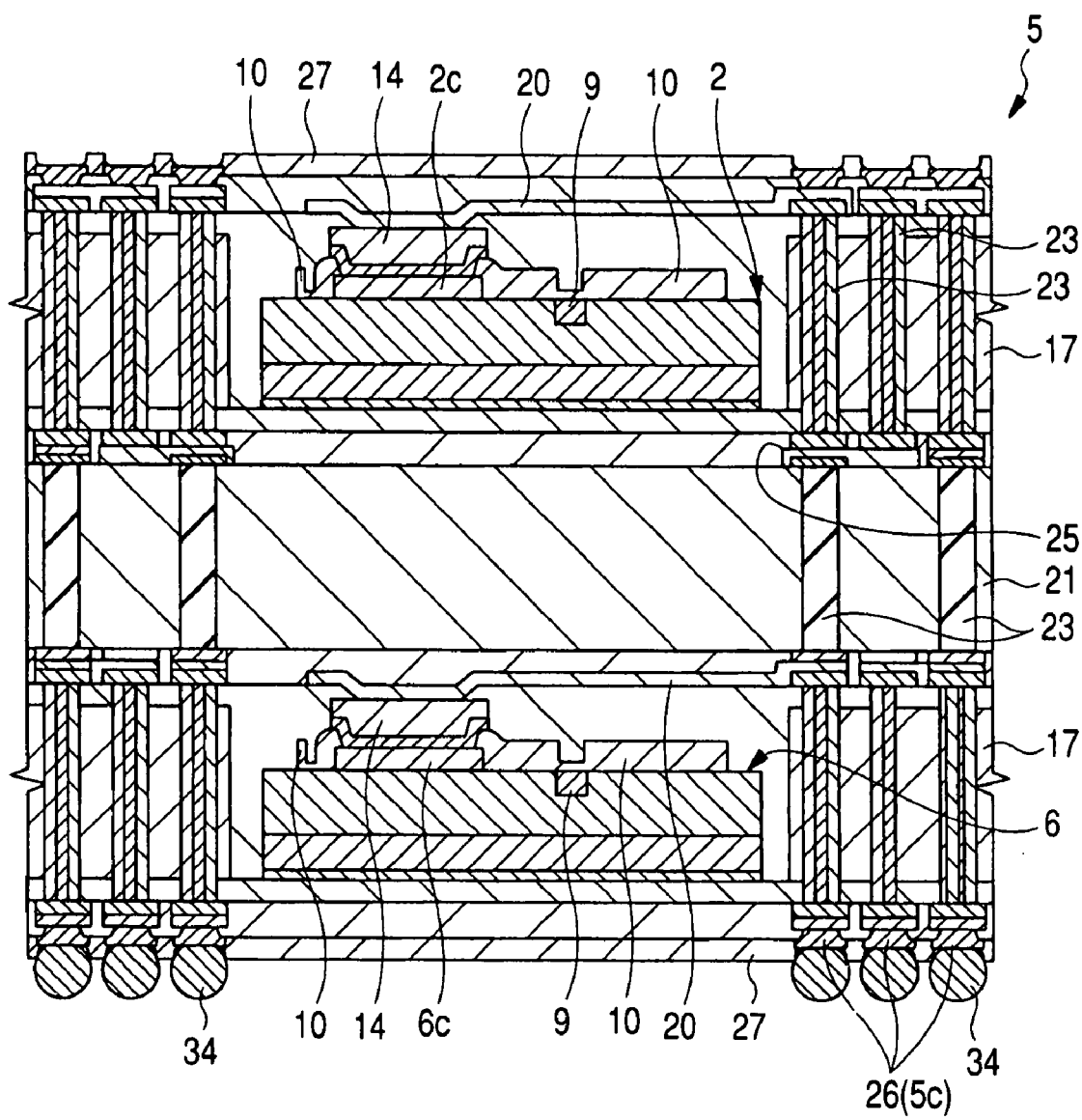
FIG. 31 is a partial sectional view showing the structure after the mounting of the first bump electrodes according to a modified example.
Figure 32:
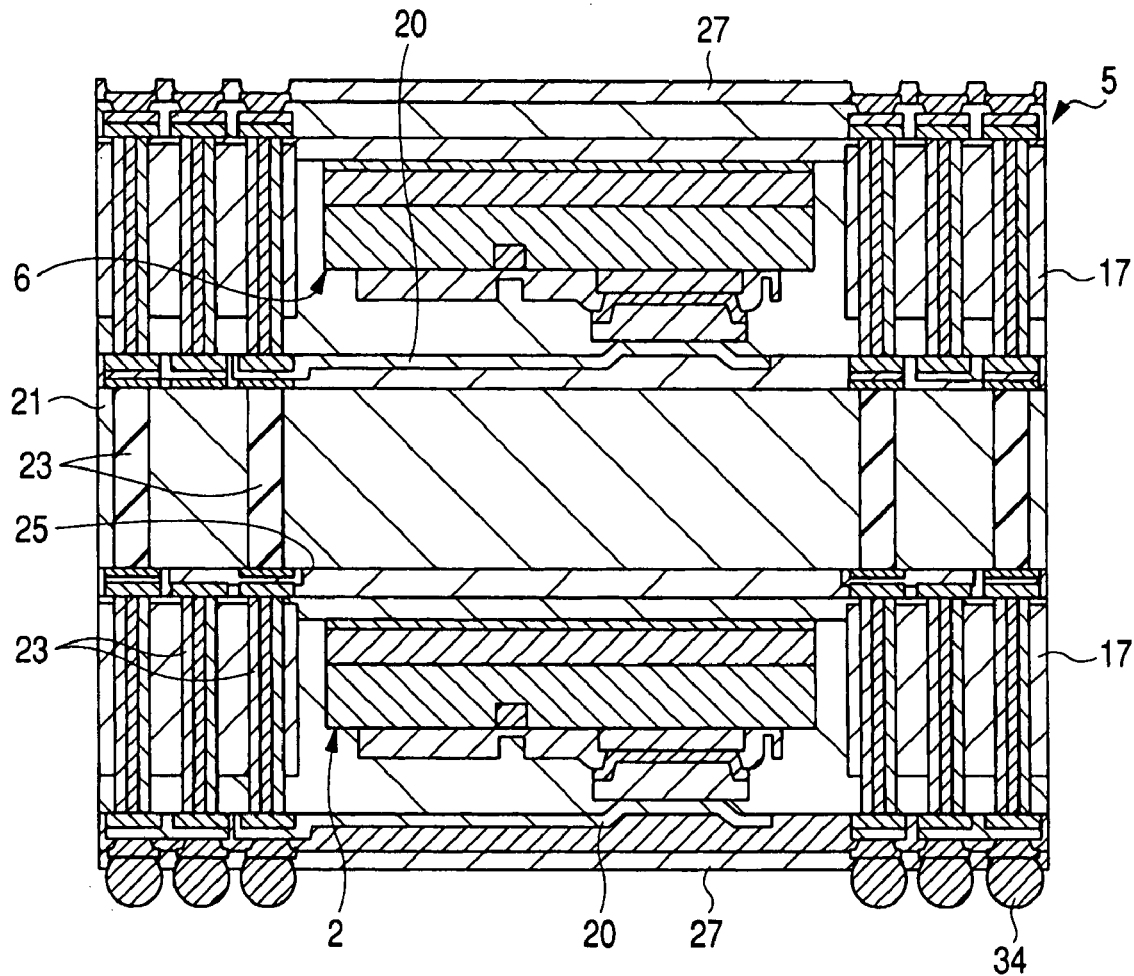
FIG. 32 is a sectional view showing a structural example after the completion of substrate division into individual pieces and test in assembling the semiconductor device of FIG. 1.
Figure 33:
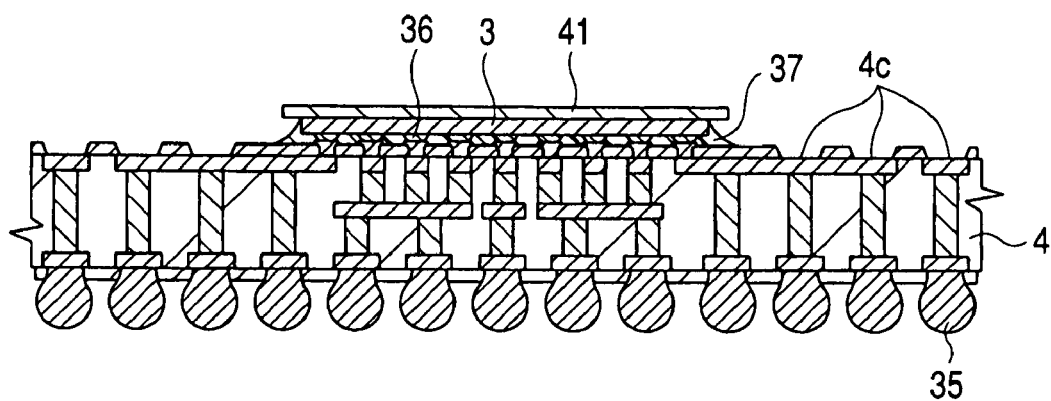
FIG. 33 is a partial sectional view showing a structural example after the completion of test of the lower package in assembling the semiconductor device of FIG. 1.

FIGS. 13 to 18 are partial sectional views showing an example of a built-in chip forming method in assembling the semiconductor device shown in FIG. 1, FIGS. 19 to 21 are partial sectional views showing an example of a chip embedding method in assembling the semiconductor device of FIG. 1, and FIGS. 22 to 25 are partial sectional views showing chip embedding methods according to modifications. FIG. 26 is a partial sectional view showing a still further step in the chip embedding method shown in FIG. 25, FIG. 27 is a partial sectional view showing an example of a built-in chip stacking method in assembling the semiconductor device of FIG. 1, FIG. 28 is a back view showing an example of a substrate structure after the stacking of built-in chips in assembling the semiconductor device of FIG. 1, and FIG. 29 is a sectional view showing a structural example. FIG. 30 is a partial sectional view showing a structural example after the mounting of first bump electrodes in assembling the semiconductor device of FIG. 1, FIG. 31 is a partial sectional view showing the structure after the mounting of the first bump electrodes according to a modified example, FIG. 32 is a sectional view showing a structural example after the completion of substrate division into individual pieces and test in assembling the semiconductor device of FIG. 1, and FIG. 33 is a partial sectional view showing a structural example after the completion of test of the lower package in assembling the semiconductor device of FIG. 1.

Figure 34:
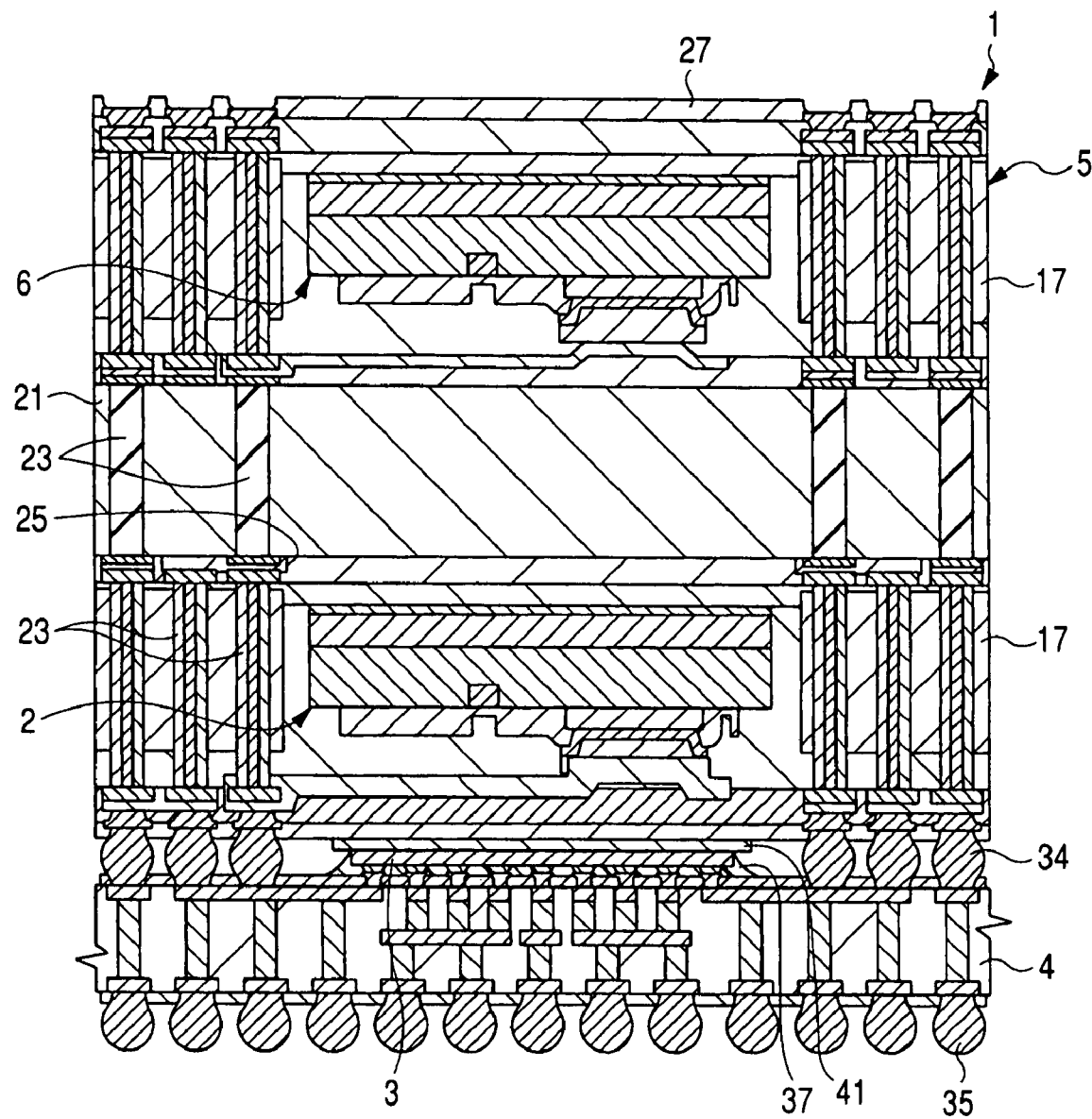
FIG. 34 is a partial sectional view showing a structural example after the completion of assembly of the semiconductor device shown in FIG. 1.
Figure 35:
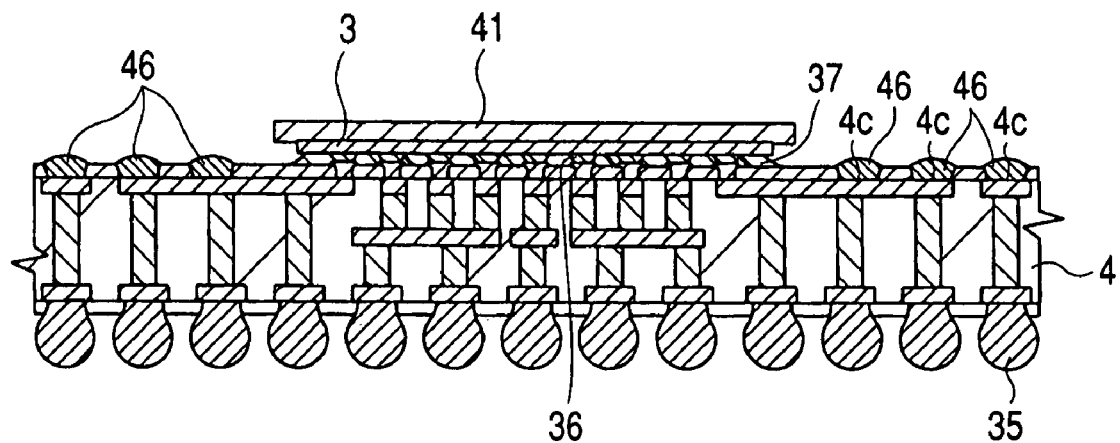
FIG. 35 is a partial sectional view showing a structural example at the time of forming receptive solder in assembling the semiconductor device of FIG. 1.
Figure 38:
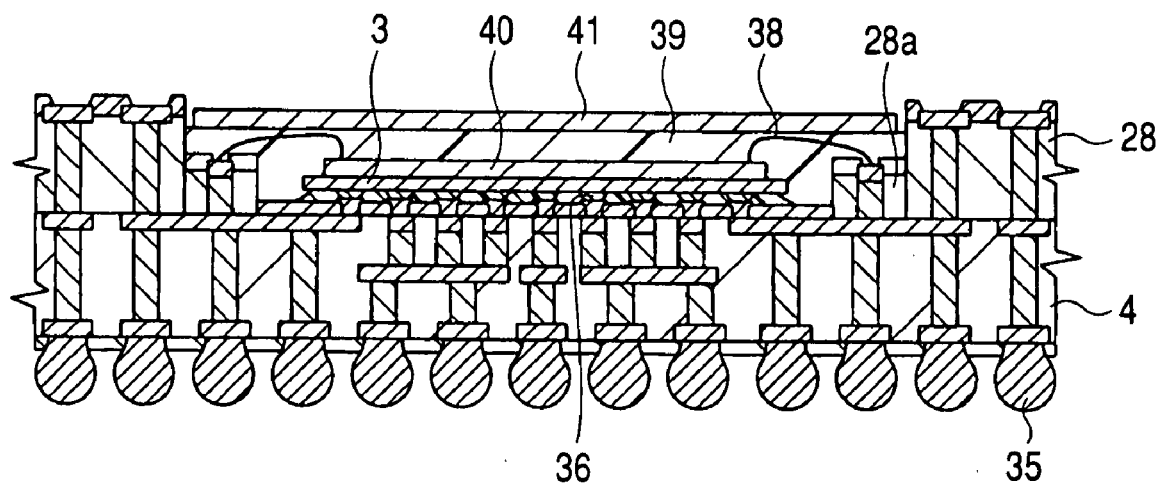
FIG. 38 is a partial sectional view showing the structure after the completion of test of a lower package according to a further modified example.
Figure 39:
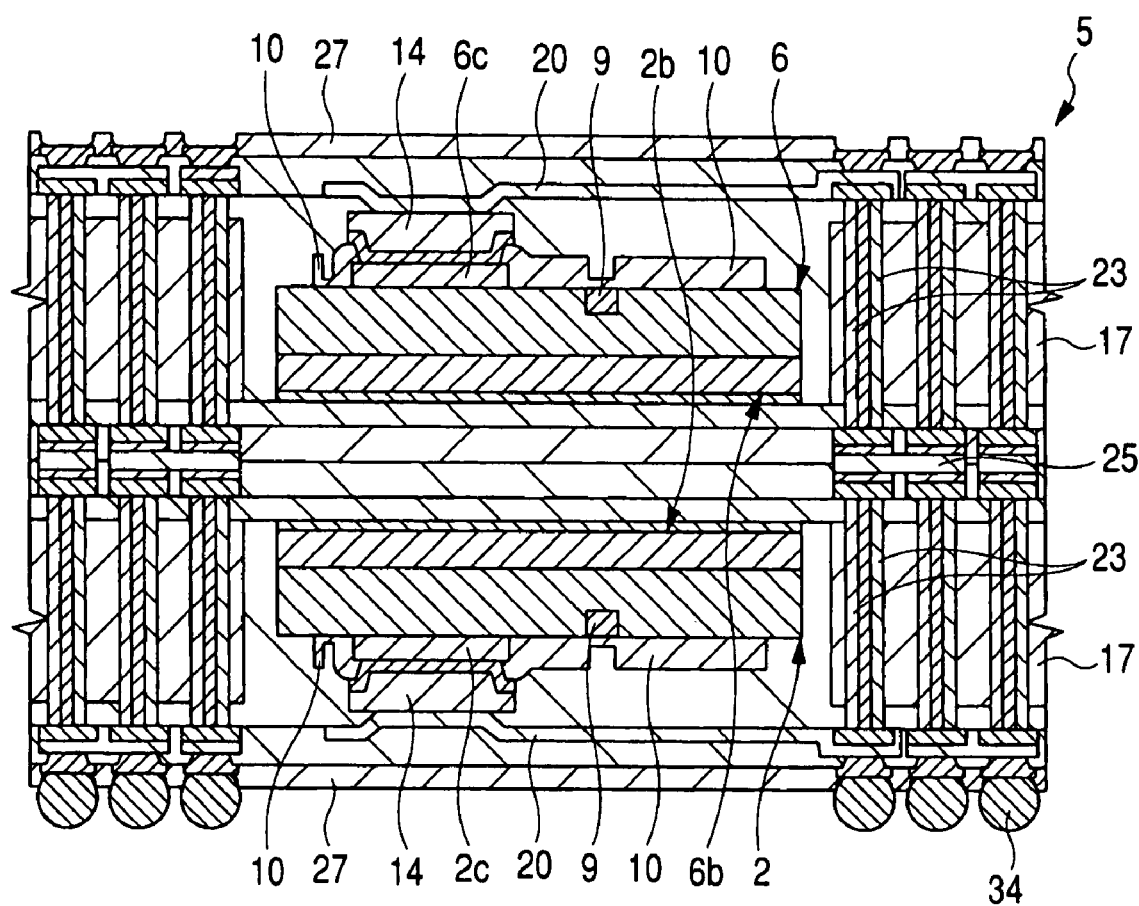
FIG. 39 is a partial sectional view showing the structure after the mounting of first bump electrodes in assembling a semiconductor device according to a still further modified example.

Further, FIG. 34 is a partial sectional view showing a structural example after the completion of assembly of the semiconductor device shown in FIG. 1, FIG. 35 is a partial sectional view showing a structural example at the time of forming receptive solder in assembling the semiconductor device of FIG. 1, FIGS. 36 to 38 are partial sectional views each showing the structure after the completion of test of a lower package according to a modified example, and FIG. 39 is a partial sectional view showing the structure after the mounting of first bump electrodes in assembling a semiconductor device according to a still further modified example.

Figure 13:
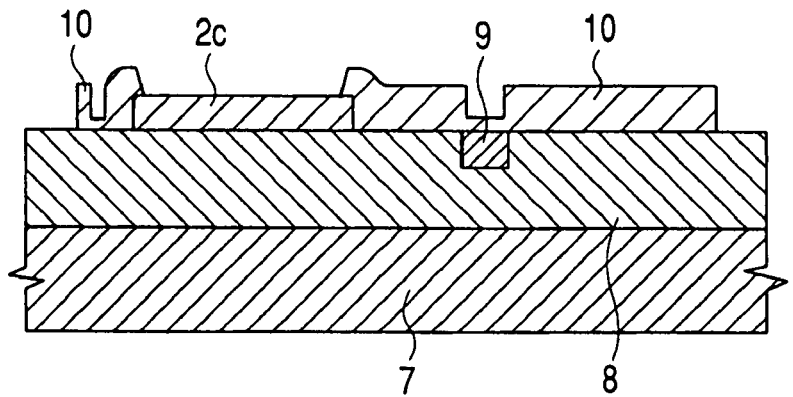
FIG. 13 is a partial sectional view showing an example of a built-in chip forming method in assembling the semiconductor device of FIG. 1.

First, as shown in FIG. 13, for a device having a device layer 8 formed on an Si base 7 and further having first electrode pads 2c and a passivation film 10 both formed on the device layer 8, there are performed probe check and cutting of a fuse 9 to afford a device of good quality.

Figure 14:
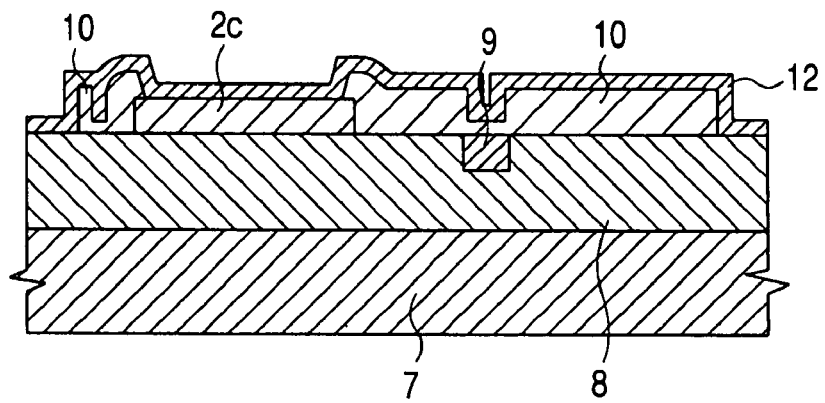
FIG. 14 is a partial sectional view showing a further step in the built-in chip forming method.

Thereafter, as shown in FIG. 14, a seed layer 12 as an electrode layer is formed on the first electrode pads 2c and the passivation film 10.

Figure 15:
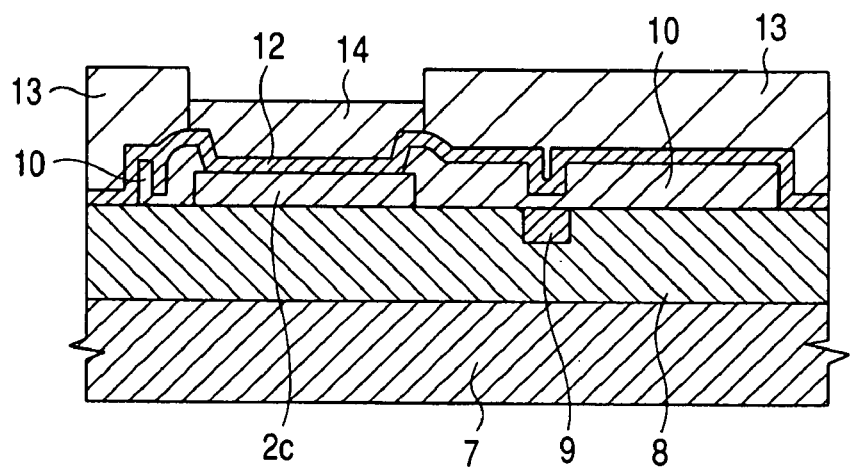
FIG. 15 is a partial sectional view showing a still further step in the built-in chip forming method.

Thereafter, as shown in FIG. 15, a resist film 13 is formed on the seed layer 12, then the resist film 13 which overlies the first electrode pads 2c is removed in a predetermined shape, and then Cu electrodes 14 are formed on the seed layer 12 which overlies the first electrode pads 2c.

Figure 16:
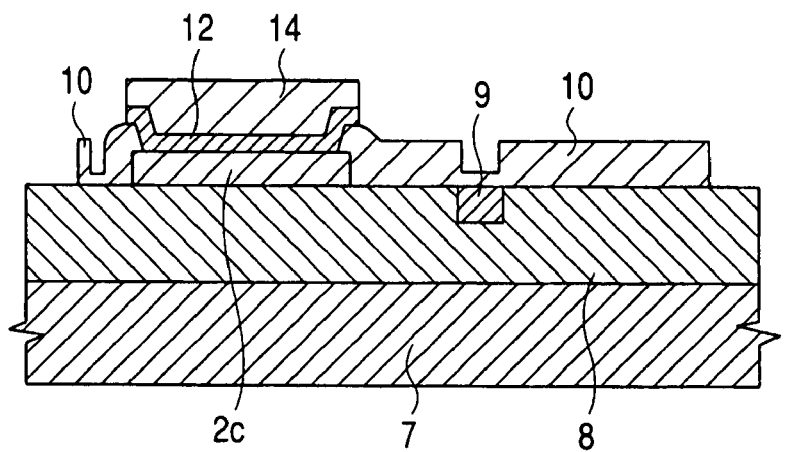
FIG. 16 is a partial sectional view showing a still further step in the built-in chip forming method.

Thereafter, as shown in FIG. 16, the resist film and the seed film 12 located around the Cu electrodes 14 are removed to complete the Cu electrodes 14 on the first electrode pads 2c. The Cu electrodes 14 may be formed by a method other than the sputtering method.

Figure 17:
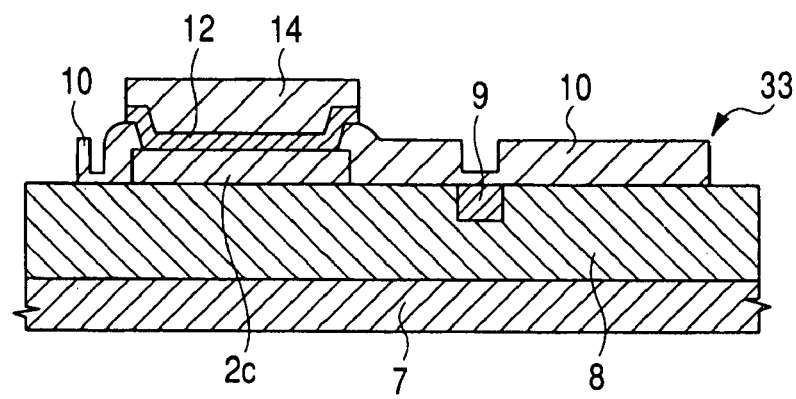
FIG. 17 is a partial sectional view showing a still further step in the built-in chip forming method.

Thereafter, as shown in FIG. 17, a thin film device 33 is formed by polishing a back surface of the Si base.

Figure 18:
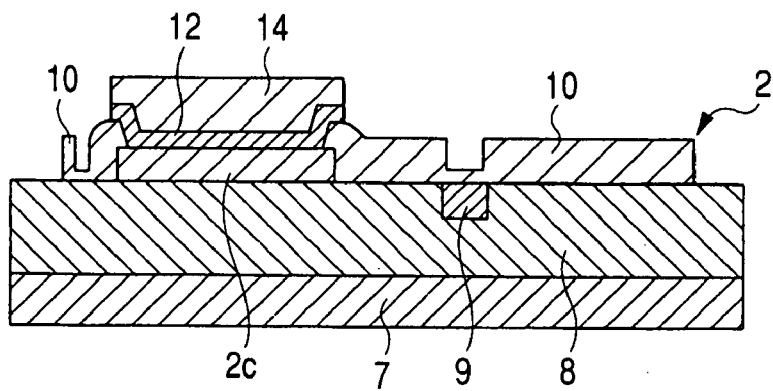
FIG. 18 is a partial sectional view showing a still further step in the built-in chip forming method.

Thereafter, the first memory chip 2 shown in FIG. 18 is obtained by dicing into individual pieces.

Figure 19:
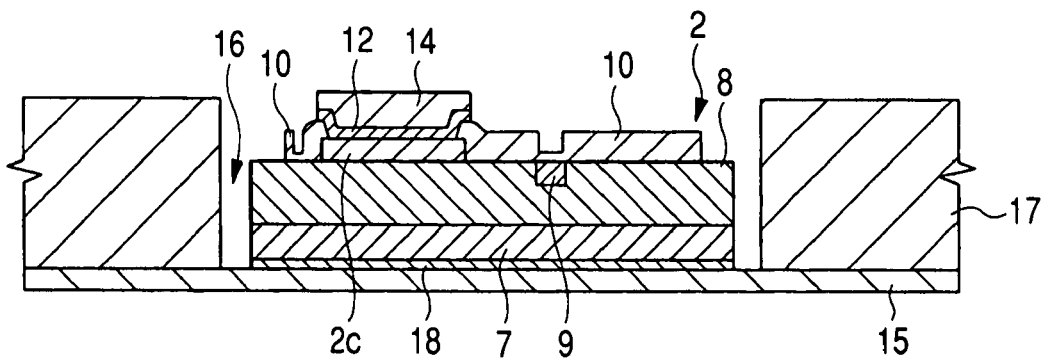
FIG. 19 is a partial sectional view showing an example of a chip embedding method in assembling the semiconductor device of FIG. 1.

Thereafter, as shown in FIG. 19, a first base substrate 15 of a matrix type is provided and a resin layer 17 and a cavity 16 as a concave portion are formed on the first base substrate 15.

Thereafter, the first memory chip 2 formed above in connection with FIG. 18 is disposed within the cavity 16 formed on the first base 15 and is fixed with a die bonding material 18.

Figure 20:
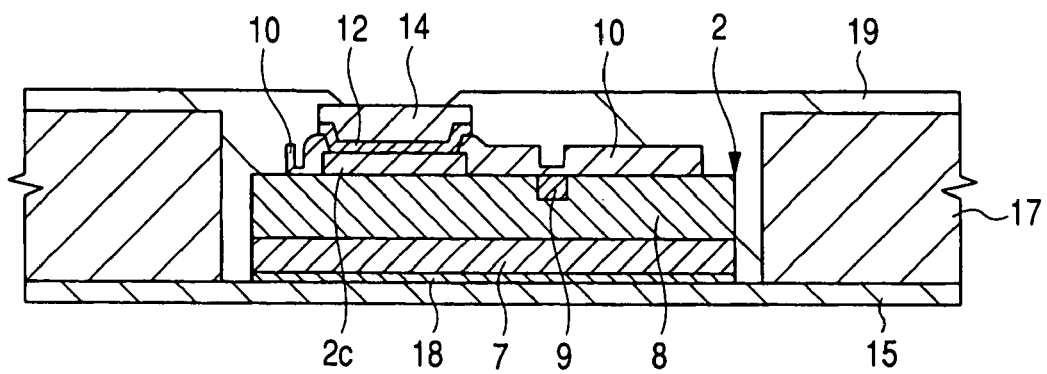
FIG. 20 is a partial sectional view showing a further step in the chip embedding method.

Thereafter, within the cavity 16, an insulating material 19, e.g., epoxy resin, is charged onto the first memory chip 2 and the portion above the Cu electrode 14 on each first electrode pad 2c of the first memory chip 2 is opened, as shown in FIG. 20.

Figure 21:
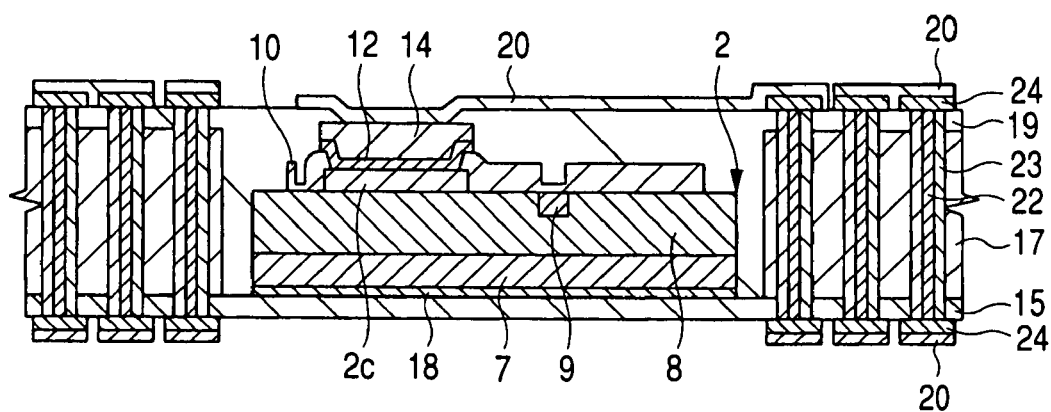
FIG. 21 is a partial sectional view showing a still further step in the chip embedding method.

Thereafter, through holes are formed in predetermined positions of the resin layer 17 with use of a laser. Subsequently, as shown in FIG. 21, through hole wiring lines 23 are formed on inner walls of the through holes by plating and a filler material 22 is embedded into the through holes. Further, there are formed conductor patterns 20 as wiring patterns to be connected to the Cu electrodes 14 and via pads 24 for connecting between the conductor patterns 20 and the through hole wiring lines 23. At this time, the via pads 24 are covered with the conductor patterns 20.

Figure 22:
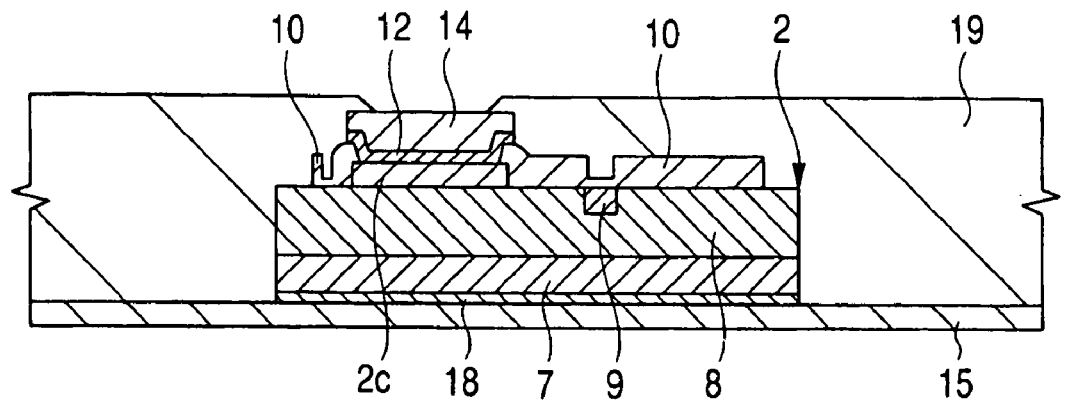
FIG. 22 is a partial sectional view showing a modified example of a chip embedding method.

As shown in the modified example of FIGS. 22 and 23, there may be adopted a structure wherein, after the mounting of a chip onto the first base substrate 15, the portion around the chip is covered with an insulating material 19, e.g., prepreg. After the covering with the insulating material 19, the portion above the Cu electrode 14 on the first electrode pad 2c may be opened. Thereafter, there are formed via pads 24 and conductor patterns 20 which cover the via pads 24 and which are connected to the Cu electrodes 14.

As shown in the modified example of FIGS. 24 and 25, there may be adopted a structure wherein the cavity structure shown in FIG. 19 is utilized and the insulating material, e.g., epoxy resin, is not disposed on the resin layer 17. That is, the insulating material 19 is charged into the cavity 16 alone.

Thereafter, as shown in FIG. 26, an insulating layer 11, e.g., prepreg layer, is formed on the conductor patterns 20 and pads 26 are formed on the via pads 24.

Thereafter, a second base substrate 21 is provided as shown in FIG. 27. The second base substrate 21 is almost equal in thickness to the resin layer 17 (including the first base substrate 15). Through hole wiring lines 23, as well as via pads 24 and relay patterns 25 connected to the through holes 23, are formed at predetermined positions of the second base substrate 21.

Thereafter, as shown in FIGS. 28 and 29, the resin layer 17 (including the first base substrate 15) with the second memory chip 6 embedded therein is disposed on a surface side of the second base substrate 21, further, the resin layer 17 (including the first base substrate 15) with the first memory chip 2 embedded therein is disposed on a back surface side of the second base substrate 21, and the second base substrate 21 and the resin layers on both surface and back surface of the substrate are bonded together by hot pressing. At this time, the resin layers 17 and the second base substrate 21 are bonded together so that the second memory chip 6 and the first memory chip 2 on both surface and back surface of the second base substrate 21 face in the same direction.

As a result, the second memory chip 6 and the first memory chip 2 are stacked in an interposed state of the second base substrate 21 therebetween and the wirings of the upper and lower memory chips can be made equal to each other in length. As shown in FIG. 29, conductor patterns 20 connected respectively to the second memory chip 6 and the first memory chip 2 are connected via through hole wiring lines 23 to a relay pattern 25 at portion A, whereby the wiring lines are made equal to each other in length (black wiring lines in FIG. 29 correspond to the equilength wiring lines).

Thereafter, resist films 27 are formed on both surface and back surface of the substrate.

In this way there is obtained a completed package structure wherein the first and second memory chips 2, 6 are stacked and embedded and wiring lines are rendered equal in length.

Thereafter, as shown in FIG. 30, first solder bumps 34 are connected to the pads 26 (second bonding leads 5c) on the back surface 5b of the completed package structure (second wiring substrate 5).

In the modified example shown in FIG. 31, the first solder bumps 34 is connected to the pads 26 (second bonding leads 5c) of the completed package structure (second wiring substrate 5) so that the device surfaces of the first and second memory chips 2, 6 face upward when connecting the second wiring substrate 5 onto the first wiring substrate 4. That is, the first solder bumps 34 are connected to the pads 26 (second bonding leads 5c) formed on the main surface 5a of the completed package structure (second wiring substrate 5), whereby even if the substrate is warped, its mounting performance can be improved and so can be the heat dissipating performance thereof.

Thereafter, as shown in FIG. 32, the substrate is diced to form the second wiring substrate 5 and there is performed a memory test of the completed package structure (memory stack package).

Thereafter, as shown in FIG. 33, there is provided a first wiring substrate 4 (completed package structure) having a microcomputer chip 3 mounted thereon by flip-chip bonding and second solder bumps 35 connected thereto and having been subjected to a test.

Thereafter, as shown in FIG. 34, the completed package structure having the second wiring substrate 5 as an upper substrate and the completed package structure having the first wiring substrate 4 as a lower substrate are connected together through the first solder bumps 34 to complete assembling of the SIP 1.

When connecting the first and second wiring substrates 4, 5 with each other, the second wiring substrate 5 is mounted onto the first wiring substrate 4 under the application of heat and load. As shown in FIG. 35, it is preferable that receptor solder be applied beforehand onto the first bonding leads 4c of the first wiring substrate 4 and that connection be made between the receptor solder and the first solder bumps 34 connected to the second wiring substrate 5. That is, it is preferable that solder paste 46 as receptive solder be applied beforehand onto the first bonding leads 4c formed on the main surface 4a of the first wiring substrate 4 and that head and load are applied to connect the first solder bumps 34 and the solder paste 46 with each other, thereby mounting the second wiring substrate 5 onto the first wiring substrate 4.

This is for the following reason. The second wiring substrate 5 as an upper substrate is apt to warp because the first and second memory chips 2, 6, which are thin, are embedded stackedly in the second siring substrate 5. Therefore, if solder paste 46 (receptive solder) is applied beforehand onto the first bonding leads 4c of the first wiring substrate 4 as a lower substrate and the second wiring substrate 5 is mounted by the application of heat and load, it is possible to absorb warping of the second wiring substrate 5 as an upper substrate and effect solder connecting when connecting the second wiring substrate 5 as an upper substrate and the first wiring substrate 4 as a lower substrate with each other. When the second wiring substrate 5 is released from the heat and load, it again warps, but by that time the connecting between the first and second wiring substrates 4, 5 is completed by hardening of the solder and therefore there is no fear of occurrence of a defective connecting.

A mere application of heat and load will do without applying the solder paste 46 to the first wiring substrate 4. More preferably, however, the solder paste 46 as receptive solder is applied beforehand to the first wiring substrate 4, whereby the second wiring substrate 5 with chips installed therein and apt to warp can be mounted in a more positive manner.

That is, by adopting the receptive solder technique, the second wiring substrate 5 incorporating plural chips and apt to warp can be disposed on the upper side and mounted with solder. As a result, the first wiring substrate 4 with the microcomputer chip 3 mounted thereon and difficult to warp can be disposed on the lower side and the second wiring substrate 5 easy to warp can be mounted on the first wiring substrate 4 through the first solder bumps 34, thus making it possible to effect mounting of the second wiring substrate 5 on the user side.

Figure 36:
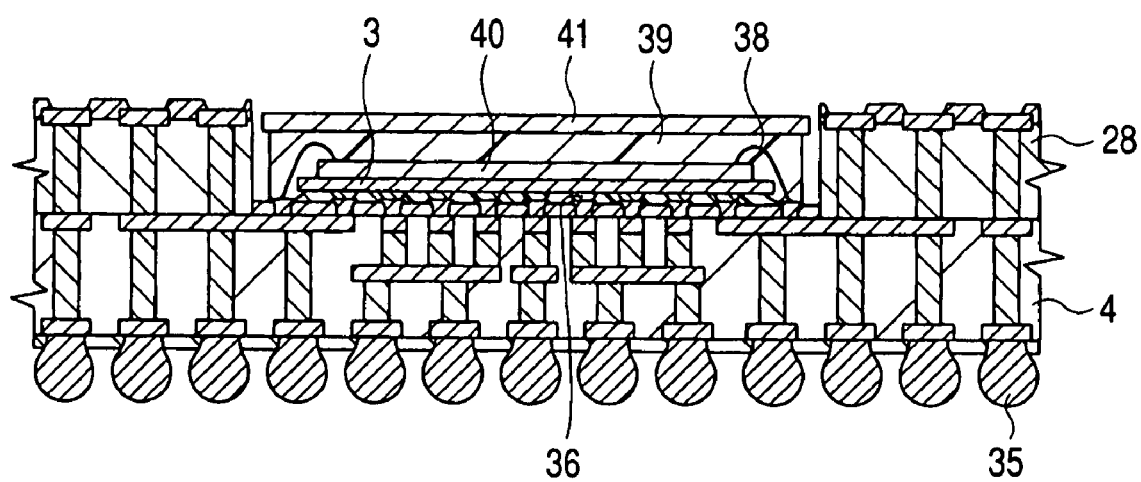
FIG. 36 is a partial sectional view showing the structure after the completion of test of a lower package according to a modified example.
Figure 37:
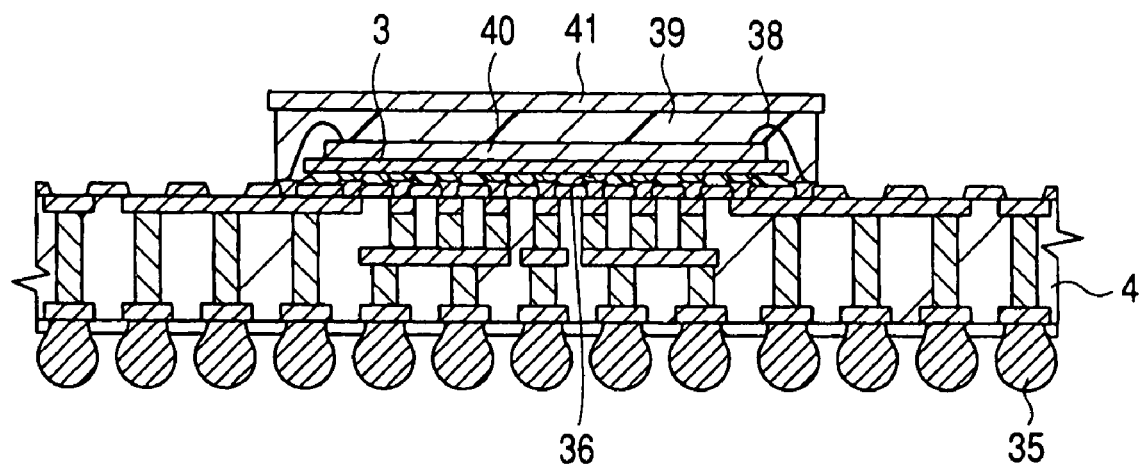
FIG. 37 is a partial sectional view showing the structure after the completion of test of a lower package according to another modified example.

Next, reference is made to FIG. 36 which shows a modified example. As the case may be, as a result of stacking both microcomputer chip 3 and memory chip 40 onto the first wiring substrate 4, the height of the sealing body 39 which seals those chips with resin becomes larger. Sonsequently, it is impossible to adopt the POP (Package On Package) structure wherein another package is stacked around the sealing body 39 through the first solder bumps 34. Therefore, a test is conducted through a spacer substrate 28 in order to draw out the first bonding leads 4c on the first wiring substrate 4 up to a position higher than the upper surface of the sealing body 39. After the test is over, it is possible to make restoration to the original structure of the first wiring substrate 4 by removing the spacer substrate 28.

According to an another modified example shown in FIG. 38, in connection with the microcomputer chip 3 and the memory chip 40 stacked on the first wiring substrate 4, when connecting the memory chip 40 as an upper chip and the substrate with each other through wires 38, stepped portions 28a are formed inside a cavity of the spacer substrate 28 and a test is conducted with wires 38 connected to electrodes of the stepped portions 28a. With the stepped portions 28a, even if under-fill resin is injected between the flip-chip-bonded microcomputer chip 3 and first wiring substrate 4, the bonding leads on the first wiring substrate 4, which are connected to the memory chip 40 electrically through wires 38, become difficult to be covered with the under-fill resin.

According to a further modified example shown in FIG. 39, when embedding the first and second memory chips 2, 6 stackedly into the second wiring substrate 5, both chips are stacked so as to face opposite to each other. That is, both chips are stacked in a state in which the back surface 2b of the first memory chip 2 and the back surface 6b of the second memory chip 6 confront each other. Also in this structure, wiring lines can be made equal in length by connecting both chips to the relay patterns 25 via through hole wiring lines 23.

Second Embodiment

Figure 40:
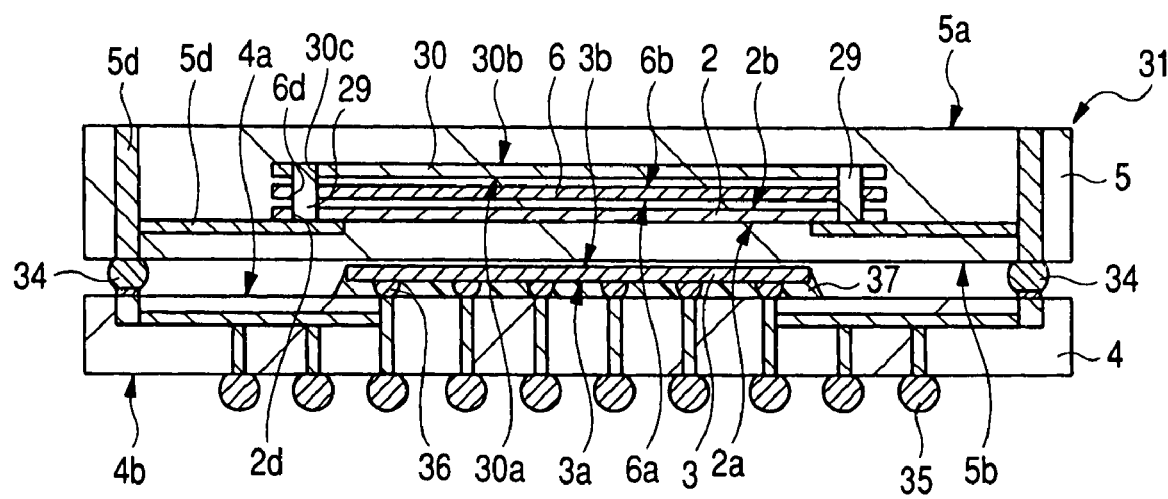
FIG. 40 is a sectional view showing schematically a structural example of a semiconductor device according to a second embodiment of the present invention.
Figure 41:
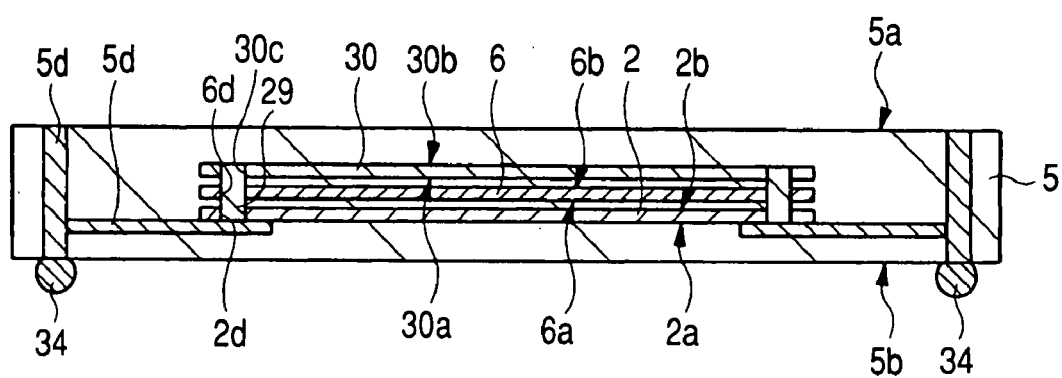
FIG. 41 is a sectional view showing the structure of an upper package in the semiconductor device of FIG. 40.
Figure 42:
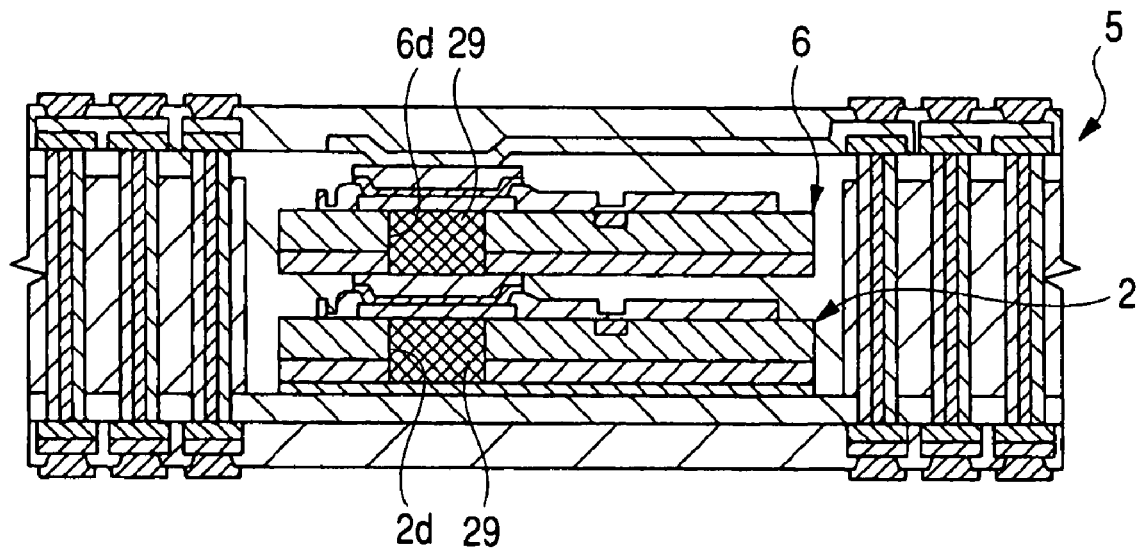
FIG. 42 is a partial sectional view showing an example of an internal structure of a substrate of the upper package shown in FIG. 41.

FIG. 40 is a sectional view showing schematically a structural example of a semiconductor device according to a second embodiment of the present invention, FIG. 41 is a sectional view showing the structure of an upper package in the semiconductor device of FIG. 40, and FIG. 42 is a partial sectional view showing an example of an internal structure of a substrate of the upper package shown in FIG. 41.

In an SIP 31 of this second embodiment shown in FIG. 40, semiconductor chips installed within a second wiring substrate 5 have through holes 2d, 6d and 30c respectively, with conductors 29 being embedded within the through holes 2d, 6d and 30c to render wiring lines equal in length.

More specifically, as shown in FIG. 41, a first memory chip 2, a second memory chip 6 and a third memory chip 30 are embedded stackedly into the second wiring substrate 5 and it is possible for this structure to afford a completed package structure and conduct a memory test. Those chips are stacked in a state in which respective main surfaces 2a, 6a, 30a face in the same direction and so do respective back surfaces 2b, 6b, 30b, and the chips are connected together electrically through the conductors 29 embedded into the through holes 2d, 6d and 30c.

FIG. 42 shows the details of a completed package structure having a second wiring substrate 5 with only first and second memory chips 2, 6 stacked and embedded therein. Also in this completed package structure it is possible to render wiring lines equal in length through conductors 29 because the chips are thin. As a result, it is possible to obtain the same effects as in the SIP 1 of the first embodiment.

Third Embodiment

Figure 43:
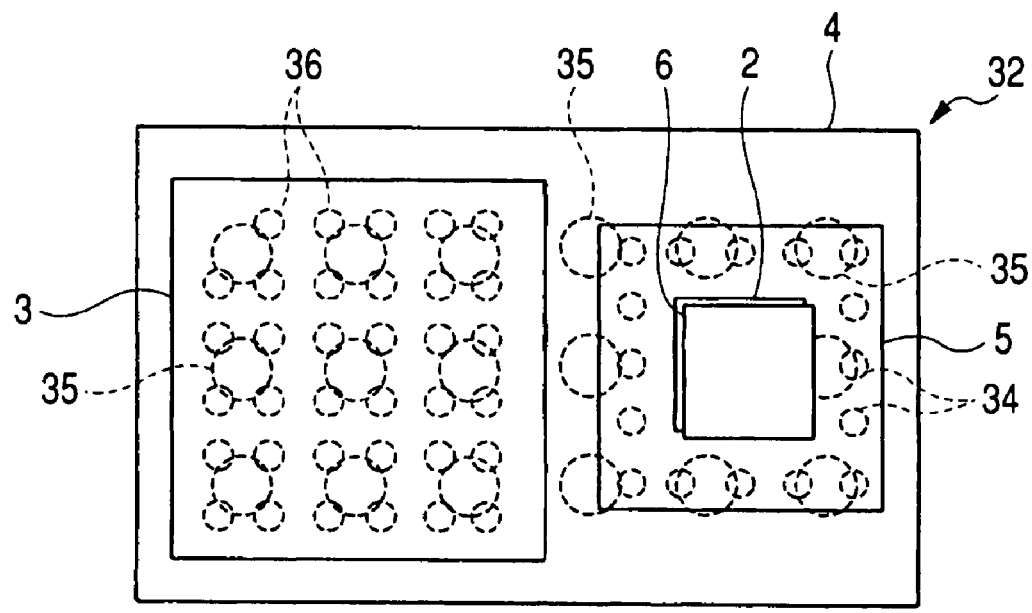
FIG. 43 is a plan view showing a structural example of a semiconductor device according to a third embodiment of the present invention schematically in a see-through state.
Figure 44:
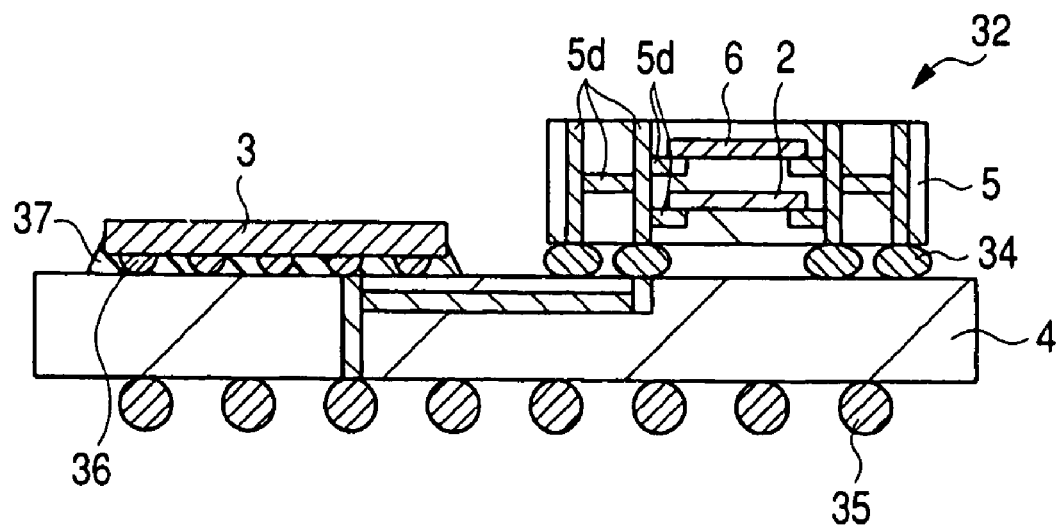
FIG. 44 is a sectional view of the semiconductor device shown in FIG. 43.

FIG. 43 is a plan view showing a structural example of a semiconductor device according to a third embodiment of the present invention schematically in a see-through state, FIG. 44 is a sectional view of the semiconductor device shown in FIG. 43, and FIGS. 45 to 48 are plan views and sectional views showing the structures of semiconductor devices according to modifications of the third embodiment schematically in a see-through state.

In a semiconductor device (SIP 32) of this third embodiment, when mounting the second wiring substrate 5 onto the first wiring substrate 4, a microcomputer chip 3 and the second wiring substrate 5 are mounted in a horizontal (flat) relation to each other. In SIPs 32 shown in FIGS. 43, 45 and 47, their internal structures are shown in a see-through state from above.

FIGS. 43 and 44 show a structure wherein the second wiring substrate 5 with first and second memory chips 2, 6 stacked and embedded therein is mounted through first solder bumps 34 and sideways of the microcomputer 3 which is flip-chip-bonded onto the first wiring substrate 4 through gold bumps 36. Plural second solder bumps 35 are provided on the back surface side of the first wiring substrate 4.

Figure 45:
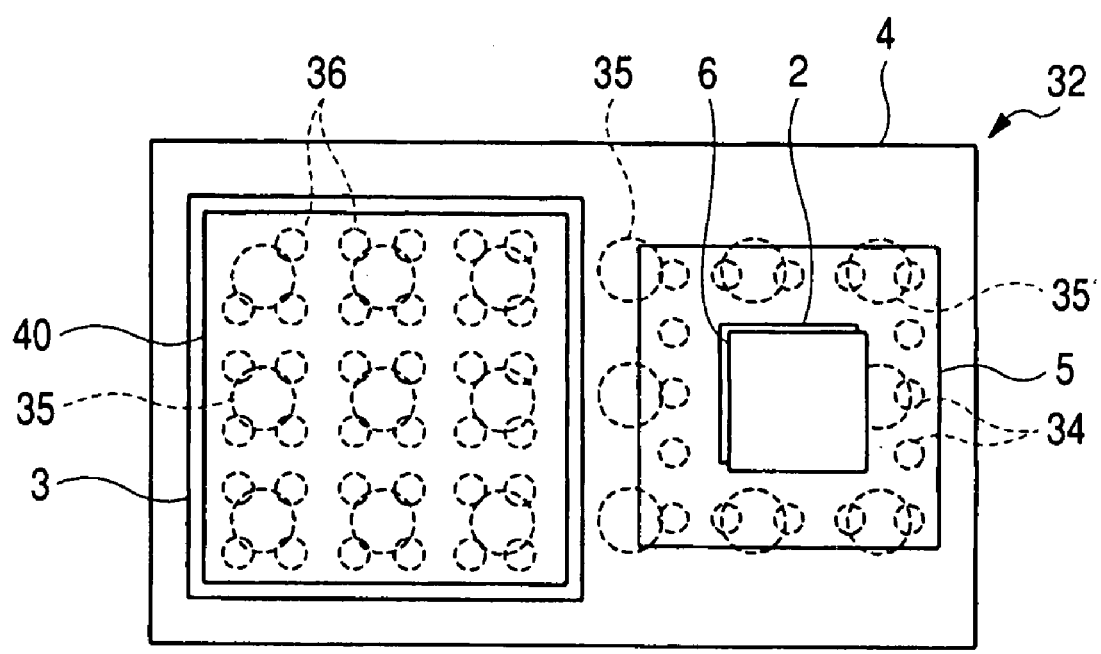
FIG. 45 is a plan view showing the structure of a semiconductor device according to a modification of the third embodiment schematically in a see-through state.
Figure 46:
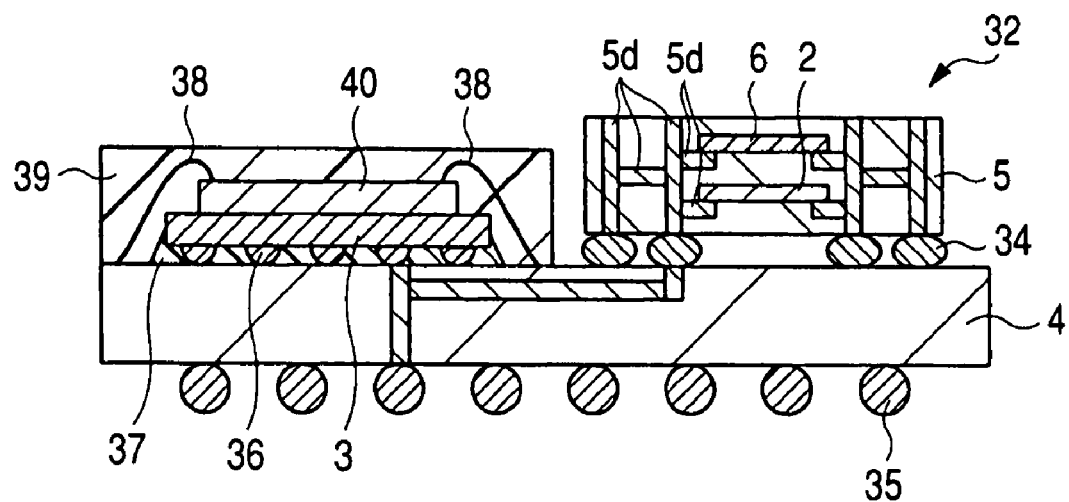
FIG. 46 is a sectional view of the semiconductor device shown in FIG. 45.

In the SIP 32 shown in FIGS. 45 and 46, a microcomputer chip 3 is flip-chip-bonded onto the first wiring substrate 4 through gold bumps 36 and for example a memory chip 40 is stacked on the microcomputer chip 3. Also in this case, the second wiring substrate 5 with first and second memory chips 2, 6 stacked and embedded therein is mounted sideways of the microcomputer chip 3 through first solder bumps 34. Further, plural second solder bumps 35 are provided on the back side of the first wiring substrate 4.

Figure 47:
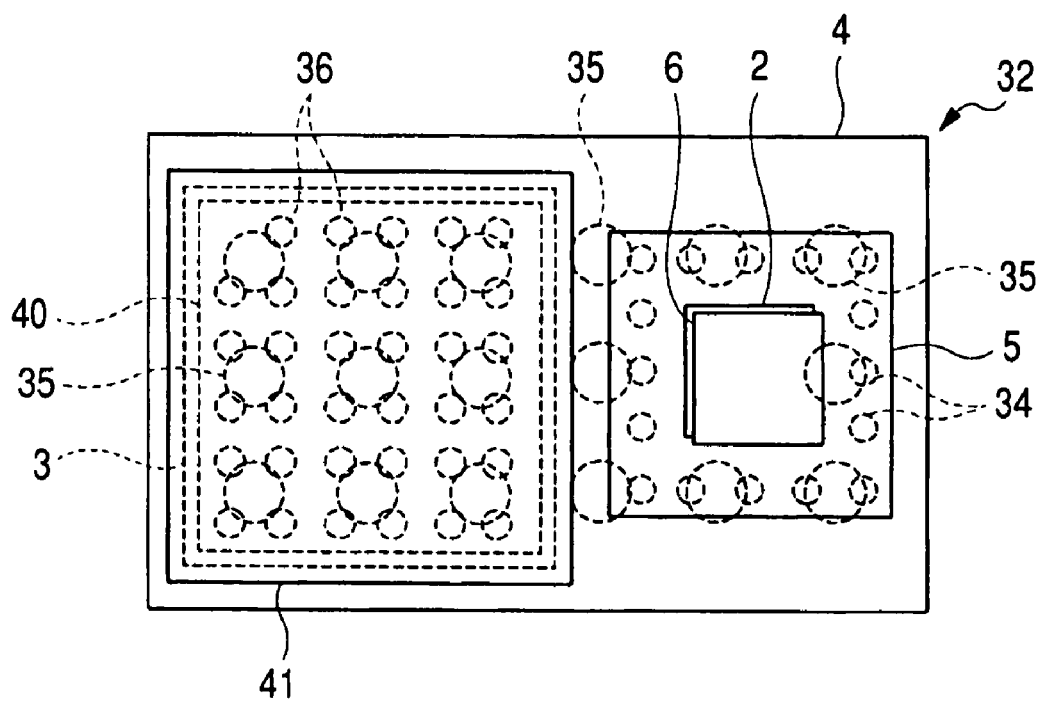
FIG. 47 is a plan view showing the structure of a semiconductor device according to another modification of the third embodiment schematically in a see-through state.
Figure 48:
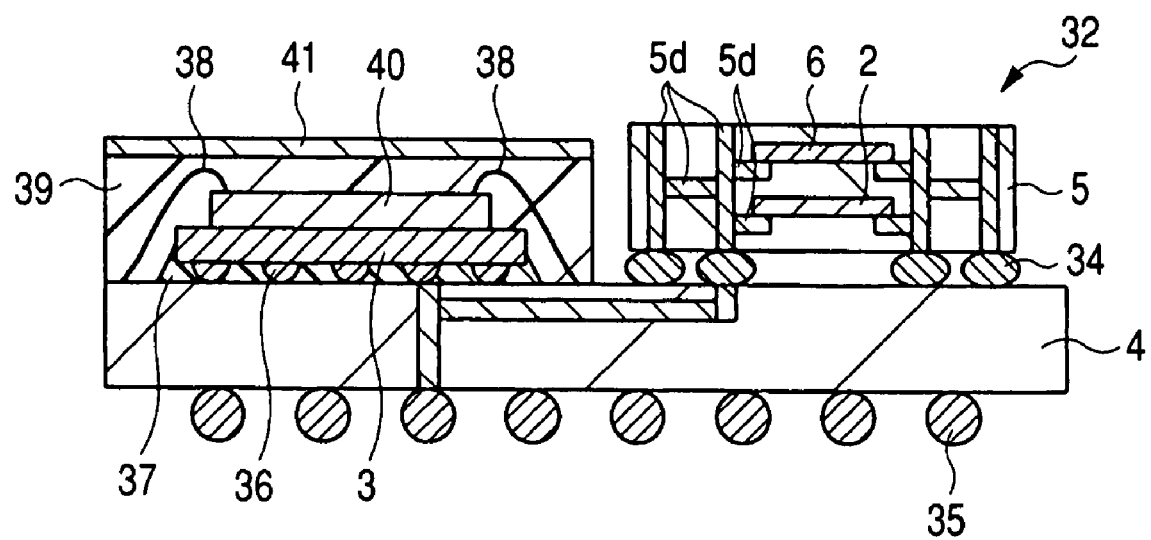
FIG. 48 is a sectional view of the semiconductor device shown in FIG. 47.

In the SIP 32 shown in FIGS. 47 and 48, a heat dissipating plate 41 is further disposed above the memory chip 40 which is stacked on the microcomputer chip 3 of the SIP 32 shown in FIG. 45. The other structure than the heat dissipating plate 41 is the same as the SIP 32 of FIG. 45.

Also in the SIPs 32 shown in FIGS. 43 to 48, wiring lines of plural semiconductor chips can be made equal in length in the second wiring substrate 5 mounted on the first wiring substrate 4 and with chips installed therein. Thus, it is possible to obtain the same effect as in the SIP 1 of the first embodiment.

Although the present invention has been described above concretely on the basis of embodiments thereof, it goes without saying that the present invention is not limited to the above embodiments, but that various changes may be made within the scope not departing from the gist of the invention.

For example, although in the above first to third embodiments two or three semiconductor chips are installed stackedly within the second wiring substrate 5 as an upper substrate, the number of semiconductor chips to be stacked within the second wiring substrate is not specially limited insofar as it is not smaller than two.

Further, the bumps for use in flip-chip bonding of the microcomputer chip 3 are not limited to gold bumps, but there may be used solder bumps. In the case where the microcomputer chip 3 and the second wiring substrate 5 incorporating memory chips (first and second memory chips 2, 6) are mounted in a horizontal relation to each other as shown in FIGS. 43 to 48, both may be mounted on the first wiring substrate 4 and then subjected to a reflow process at a time. Thus, the mounting process can be simplified in comparison with the case of using Au bumps.

The present invention is suitable for an electronic device having a microcomputer chip and memory chips.

What is claimed is:

1. A semiconductor device comprising:
a first wiring substrate having a first main surface and a first back surface opposed to the first main surface;
a plurality of first bonding leads formed on the first main surface of the first wiring substrate;
a microcomputer chip mounted over the first main surface of the first wiring substrate;
a second wiring substrate disposed over the microcomputer chip and having a second main surface, a second back surface opposed to the second main surface, a plurality of second bonding leads formed on the second back surface, a first internal wiring line formed between the second main surface and the second back surface, and a second internal wiring line formed between the second main surface and the second back surface;
a first memory chip having a first electrode pad electrically connected with one of the second bonding leads via the first internal wiring line, and arranged between the second main surface and the second back surface;
a second memory chip having a second electrode pad electrically connected with one of the second bonding leads via the second internal wiring line, and arranged between the second main surface and the second back surface;
a plurality of first bump electrodes electrically connecting the first bonding leads of the first wiring substrate with respective second bonding leads of the second wiring substrate; and
a plurality of second bump electrodes disposed over the first back surface of the first wiring substrate,
wherein a length of the first internal wiring line is substantially the same as a length of the second internal wiring line,
wherein the microcomputer chip is electrically connected with the first memory chip via one of the first bonding leads, one of the first bump electrodes, a corresponding one of the second bonding leads, and the first internal wiring line, and is also electrically connected with the second memory chip via said one of the first bonding leads, said one of the first bump electrodes, said one of the second bonding leads, and the second internal wiring line, and
wherein the first and second memory chips are controlled by the microcomputer chip, are double data rate SDRAMs, and are configured to transfer data in synchronism with both leading and trailing edges of an external clock signal.

2. A semiconductor device according to claim 1, wherein a heat dissipating plate is disposed over one or both of the main surface of the first wiring substrate and the main surface of the second wiring substrate.

3. A semiconductor device according to claim 1, wherein the microcomputer chip is flip-chip-bonded onto the first wiring substrate.

4. A semiconductor device according to claim 1, wherein the number of the microcomputer chips mounted over the first wiring substrate is plural.

5. A semiconductor device according to claim 1, wherein an allowable range of a difference between a first distance from first electrode pads of the first memory chip to the second bonding leads of the second wiring substrate corresponding to the first electrode pads and a second distance from second electrode pads of the second memory chip to the second bonding leads corresponding to the second electrode pads is within ±2 mm.

6. A semiconductor device according to claim 5, wherein the allowable range of the difference between the first distance and the second distance is within ±1 mm.

* * * * *